(12) United States Patent
Freimann et al.

(10) Patent No.: US 12,052,982 B2
(45) Date of Patent: Aug. 6, 2024

(54) DEVICE FOR TREATING SOIL AND METHOD FOR OPERATING SUCH A DEVICE

(71) Applicant: ZASSO GROUP AG, Zug (CH)

(72) Inventors: Christopher Freimann, Eschweiler (DE); Sergio De Andrade Coutinho Filho, Indaiatuba (BR)

(73) Assignee: Zasso Group AG, Zug (CH)

( * ) Notice: Subject to any disclaimer, the term of this patent is extended or adjusted under 35 U.S.C. 154(b) by 288 days.

(21) Appl. No.: 17/436,875

(22) PCT Filed: Jan. 29, 2020

(86) PCT No.: PCT/EP2020/000027
§ 371 (c)(1),
(2) Date: Sep. 7, 2021

(87) PCT Pub. No.: WO2020/177919
PCT Pub. Date: Sep. 10, 2020

(65) Prior Publication Data
US 2022/0132831 A1   May 5, 2022

(30) Foreign Application Priority Data

Mar. 7, 2019  (DE) .................. 10 2019 001 533.9
Sep. 23, 2019  (DE) .................. 10 2019 006 646.4

(51) Int. Cl.
*A01M 21/04* (2006.01)
*G01R 31/00* (2006.01)
(Continued)

(52) U.S. Cl.
CPC ......... *A01M 21/046* (2013.01); *G01R 31/006* (2013.01); *G01R 31/1272* (2013.01); *G01R 31/52* (2020.01)

(58) Field of Classification Search
CPC .............. A01M 21/046; G01R 31/006; G01R 31/1272; G01R 31/52
See application file for complete search history.

(56) References Cited

U.S. PATENT DOCUMENTS 4,086,856 A * 5/1978 Chenoweth ............. B60F 1/043
105/72.2
4,338,743 A   7/1982 Gilmore
(Continued)

FOREIGN PATENT DOCUMENTS

CN   104714152 B   1/2018
EP   0 026 248 A1   4/1981
(Continued)

OTHER PUBLICATIONS

International Search Report with Written Opinion for PCT/EP2020/000027, dated Sep. 20, 2020, including English translation of the ISR.

*Primary Examiner* — Daniel R Miller
(74) *Attorney, Agent, or Firm* — Hahn Loeser & Parks, LLP; Bret A. Hrivnak

(57) ABSTRACT

The invention relates to a device for treating a soil, comprising the following elements: a carrier vehicle having a chassis, a housing with electrical components such as in particular a high-voltage device for generating a high voltage, and high-voltage electrodes for introducing the high voltage into a first soil region. In accordance with the invention, it comprises a measuring device with evaluation electronics for measuring a fault current or a fault voltage between individual elements of the device with respect to one another or between individual elements and an earthing which serves to divert a fault current in a second floor region.

15 Claims, 16 Drawing Sheets

Figure 1:
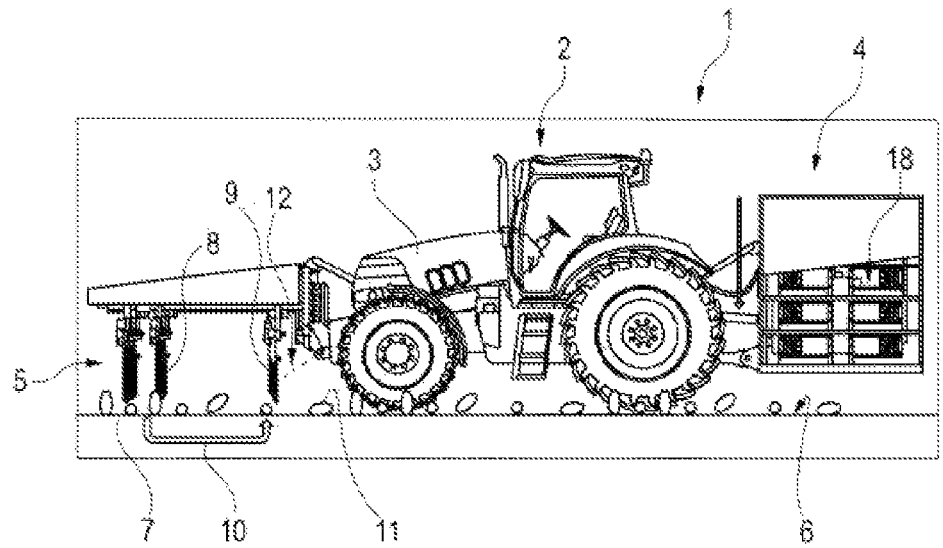

(51) Int. Cl.
*G01R 31/12* (2020.01)
*G01R 31/52* (2020.01)

(56) References Cited

U.S. PATENT DOCUMENTS

| | | | | |
|---|---|---|---|---|
| 4,428,150 A | * | 1/1984 | Geiersbach | A01M 21/046 |
| | | | | 47/1.3 |
| 6,237,278 B1 | * | 5/2001 | Persson | A01M 21/046 |
| | | | | 47/1.3 |
| 6,813,125 B1 | * | 11/2004 | Ballard, Jr. | H05B 41/2851 |
| | | | | 361/42 |
| 2006/0265946 A1 | * | 11/2006 | Schwager | A01M 21/046 |
| | | | | 47/1.3 |
| 2018/0325091 A1 | | 11/2018 | Kroeger et al. | |
| 2020/0383313 A1 | | 12/2020 | Eberius et al. | |

FOREIGN PATENT DOCUMENTS

| | | | | |
|---|---|---|---|---|
| EP | 1256275 A2 | | 11/2002 | |
| JP | H05103573 A | | 4/1993 | |
| WO | 2012059335 A1 | | 5/2012 | |
| WO | WO-2016016627 A1 | * | 2/2016 | A01H 3/04 |
| WO | 2018050138 A1 | | 3/2018 | |
| WO | 2018095451 A1 | | 5/2018 | |

\* cited by examiner

DEVICE FOR TREATING SOIL AND METHOD FOR OPERATING SUCH A DEVICE

The invention relates to a safety device comprising a high-voltage device for generating a high voltage and high-voltage electrodes for introducing the high voltage into a first soil area for weed inactivation, which consists of a specific combination of parts which can be assembled by different connection architectures in different designs of weed inactivation devices to ensure operational safety. The operation of high-voltage equipment leads to various risks for the operator of the equipment. Different devices are therefore proposed to reduce or even eliminate this risk.

One of these devices is a device comprising a chassis for treating a soil, comprising: a carrier vehicle comprising a chassis, an enclosure containing electrical components such as, in particular, a high-voltage device for generating a high voltage, and high-voltage electrodes for introducing the high voltage into a first area of the soil. Furthermore, the invention concerns a method of operating such a device.

The application deals in particular with the detection of leakage and short-circuit currents on mobile or non-mobile applications such as on tractors or manually operated devices with internal power supply and earth-contacting high-voltage electrodes. Such devices are used for weed management. In one example, a generator on a carrier vehicle, such as a tractor, is driven by a motor tap to provide electrical energy. The energy can also be provided by a small manually operated device. Transformers are used to generate high voltage, which, after rectification with the aid of electrodes, causes a current to flow through the plants. This current flow is also called useful current flow and has a growth-impairing or destructive effect on plants, such as weeds in particular, as well as on microorganisms and animals, such as pests in particular.

In principle, there are several possibilities to provide the required electrical energy. On the one hand, a battery system with battery management on the carrier vehicle can be installed. Alternatively, a generator can be driven by an engine, which is installed on tractors as standard. Both options can be set up as a TN network or IT network.

The device with chassis can be a carrier vehicle, such as a tractor. However, it can also be a hand-guided mobile device, an automomter or any other device guided over a ground, which serves to treat the ground.

Electric cars are always developed as an IT network for construction and safety reasons. Insulation monitoring (IMD) is used to ensure that the network is always isolated from the chassis. Further applications for IT networks are supply-critical facilities such as hospitals, as a single-pole earth fault does not lead to a failure of the network. In TN networks, as they are usually used in the supply network, a residual current can be detected via differential limit current monitoring (RCD). RCD type A, which is a 30 mA residual current protective device, is usually used for this purpose. In applications where a DC component in the residual current is also to be expected, such as when charging an electric car, an RCD or an RCM (residual current monitoring) type B (universal current sensitive) can be used or an RCMU (residual current monitoring unit) can be connected upstream.

Due to capacitive coupling, for example in the area of the high-voltage transformer or due to single-pole short circuits, states can be reached in which the chassis of the device is raised to impermissible voltage levels.

Since vehicles are usually not earthed and the tyres act as insulation, such a device can be considered as isolated from the ground. Single-pole short circuits between the high voltage and the rest of the system are particularly critical. These can occur, for example, through failure of the insulation in the area of the transformer, the high-voltage cables, the applicators or any connections and connectors in the high-voltage circuit. The reason for this can be a wrong interpretation of the insulation concept or ageing mechanisms of the insulation material. Known phenomena in solid insulation such as partial discharge activity or electrical treeing due to material impurities (air inclusions, solid inclusions) can lead to material fatigue in the short, medium and long term and cause an increase in leakage currents or start breakdown mechanisms.

If liquid insulating materials are used (e.g. in oil-insulated transformers), fibre bridge failures or increased moisture or contamination can lead to failure of the insulating properties in addition to overstressing.

In the case of the devices for treating soil according to the invention, there is also the risk that the soil growth touches both an electrode and the chassis of the devices and thus directly causes a single-pole short circuit. The voltage level to which the chassis is raised in this case depends above all on the voltage at the high-voltage electrodes, the conductivity of the plant and the transition resistances from the high-voltage electrodes to the plant and from the plant to the chassis of the device (carrier vehicle).

It is therefore generally a security system for electrical weed control equipment, the first of which is a short circuit between electrodes and the rest of the system.

In order to solve these problems, it is proposed that a generic safety device consists of a high-voltage insulation monitor and/or a multi-stage electrical insulation and/or a proximity sensor and/or a proximity interlock and/or a target position detector that detects the position of the elements in relation to each other. Such a device may comprise a measuring device with evaluation electronics for measuring a fault current or a fault voltage between individual elements of the device among each other or between individual elements and an earthing which serves to divert a fault current in a second floor area.

The invention is thus based on the knowledge that there are different ways of reducing the risk of undesirable voltages. For example, in order to generate a detectable fault current in the event of an insulation fault, earthing of the vehicle or other equipment in combination with insulation monitoring can be provided. The insulation monitoring can be a low impedance, universal current sensitive earth current measurement with corresponding evaluation electronics. The evaluation electronics can be a residual current monitoring unit (RCMU). A residual current device (RCD) can be used for this purpose, such as an RCD type B, through which only the earth conductor is detected.

The housing with the electrical components may have a platform supply and a receptacle for attachments may be located between the applicator and the carrier vehicle. Preferably, an adapter is provided between the applicator and the receptacle.

The magnitude of the fault current depends on the voltage applied to the electrodes, the type of short circuit, the impedance distribution in the ground and the transition impedances of the applicators to the plant, or to the ground, and from the ground to the ground of the device, such as in particular the vehicle.

The residual current I fault can be determined as a function of the total current I total:

$$I_{Fault} = I_{Total} * \frac{Z_1}{Z_1 + Z_2}$$

The residual current can also be determined as a function of the useful current $I_{Useful}$:

$$I_{Fault} = I_{Useful} * \frac{Z_1}{Z_2}$$

Since the residual current depends on the total current, a minimum total current can be defined to generate a residual current in a faulty system. This must be achieved during operation of the device so that the fault detection can be activated in the event of a fault.

The task underlying the invention is therefore also solved by a method of operating such a device in which the introduction of the high voltage is interrupted if the fault current or fault voltage exceeds a limit value or if the proximity lock, target position detection or proximity sensor have detected a fault.

Cumulatively or alternatively, the measuring device may also indicate the location of the device where the limit value has been exceeded. This results, for example, in a broken wire detection.

Advantageous further training is the subject of the sub-claims.

In practice, this defines a switch-off condition in which the total current (or the power output) is averaged over time. If the limit value is exceeded, the device is switched off and the operator must take active action to restart the system. If it can be ensured by design that no fatal or injurious body current flows when touched, the shutdown condition can be dispensed with.

When positioning the earthing, it should be noted that the local earth potential can be raised due to the earth-contacting high voltage electrodes. By forming a voltage funnel it must be ensured that contact to earth takes place where the earth potential is lower than the defined limits of the touch voltage. If this is not the case, the chassis of the device can reach impermissible voltage levels. Taking this into account, it is suggested in the invention that the distance between the high-voltage electrodes and the earth should be at least 2 m, preferably more than 3 m.

The earthing connects the chassis of a carrier vehicle of the device or an attachment to the ground (earth potential). A good earthing element has a low resistance and the lowest possible earth contact resistance and limits the manoeuvrability of the vehicle as little as possible.

It is therefore advantageous if the earthing has a chain or a chain with cable attached to it. The cable is preferably threaded through links of the chain. A weight on the chain can ensure that one end of the chain always rests on the ground. A chain in combination with a cable offers high flexibility. Therefore the manoeuvrability of a vehicle is not affected. In order to reduce the contact resistance of the individual chain links to each other, a cable, such as a flat copper slot, can be threaded and screwed through the individual chain links. With the help of additional weights or cutting elements, the ground contact resistance can be reduced.

Cumulatively or alternatively, the grounding can therefore have at least one cutting element. This cutting element can be a cutting knife or a cutting plate. Such cutting elements can be pressed into the ground. Compared to a chain, cutting elements have the advantage of lower ground contact resistance.

As a further improvement, it is suggested that the grounding has conductive mats. Mats have the advantage that they can be used over a very large area. The heavier a mat is, the lower the earth contact resistance. This can therefore be reduced by using additional weights.

The earthing may also include at least one wheel that is electrically connected to the chassis of the carrier vehicle or an attachment. This wheel may be a support wheel for supporting the chassis or a frame and may have a brush or sliding contact. As a support wheel, the wheel can support and ground individual elements. The support wheel can also be height-adjustable to adjust the position of the electrodes.

To relieve the load on the drive vehicle and especially when using autonomous vehicles or rail vehicles, the wheels can also be used as earthing elements or as return conductors. Likewise, the wheels of non-autonomous vehicles, manned vehicles or driven vehicles can be used as earthing elements or return conductors. When used as an earthing element, a sufficiently large distance from the application area must be provided. The surface with which the wheel touches the ground is made of conductive material (e.g. metal or steel). This surface has an electrical connection to the chassis (if necessary with slip ring contacts).

Support wheels can, however, also be made of a material that is not highly conductive, such as a chewing shock compound, if these are not used as earthing elements or return conductors. Nevertheless, high-voltage insulation from the frame is essential.

To increase the probability of detection, the earthing points of the earthing can be designed redundantly and distributed as spatially as possible. Therefore, it is suggested that the grounding has several grounding points spaced at least 5 cm apart for discharging into different ground areas. These earthing points can each be fed to a sensor system or connected in parallel. An offset lengthwise and crosswise to the direction of travel can prevent the complete loss of the ground potential if the ground support surface is arranged lengthwise or crosswise to the device.

Further advantageous circuits result if a filter is arranged in parallel to the discharge of the fault current.

The high-voltage device may have several modules whose power is regulated and limited, and it may have several inverters connected in parallel.

In order to avoid a short circuit due to plants touching both a high voltage electrode and the chassis, it is suggested that the high voltage electrodes are placed in an applicator compartment insulated from the chassis or attachments. Such an applicator chamber may have solid insulation and air gaps to insulate the high voltage electrodes.

Since high ground vegetation can touch attachments or the chassis of the device, such as in particular of a carrier vehicle, the probability of an insulation fault being detected for a short time is reduced. The contact leads to a fault circuit flowing parallel to the installed grounding, which is not detectable, or to an increase in the potential of the carrier vehicle and/or attachments.

It is therefore proposed to provide insulation between the elements, such as in particular the chassis or attachments and/or the high-voltage equipment, on the one hand, and the ground on the other. The high-voltage electrodes and earthing are not insulated from the ground. In practice, in order to reduce this proportion of undetectable fault currents, the underside of the chassis and all other attachments are insulated so that the plants do not come into contact with the chassis.

It is advantageous if individual and preferably all elements are electrically insulated individually. This also allows a fault current or fault voltage to flow between these mutually insulated elements.

Especially the high voltage electrodes and applicators can be isolated separately from other elements, as well as from other high voltage electrodes or from the rest of the device.

It is particularly advantageous if individual elements such as the applicators in particular are made of electrically insulating material. Also the chassis, adapters and receptacles for attachments can not only be insulated from other elements, but also be made of electrically insulating material.

It is particularly advantageous if the device has a carrier vehicle and high-voltage electrodes are arranged in front of and to the side of the carrier vehicle for introducing the high voltage into the ground. Such a wing arrangement, which is used in the agricultural sector for various applications, makes it possible to install two further pairs of electrodes to the side of the vehicle in addition to the pair of electrodes normally used in front of the carrier vehicle in order to increase the working width.

A complete loss of the earthing elements (e.g. due to tearing off or dismantling) or incorrect commissioning (fixing the earthing elements for transport) can lead to the chassis and/or attachments not being earthed. For this reason, it must be ensured that the earthing elements are located on the designated posts during operation.

It is therefore advantageous if the device has an initial loop control to monitor the function of the earthing. Loop monitoring can ensure that mechanical loss or damage to the earthing element is detected. A quiescent current (type: several mA) is injected into a hard-wired, low-impedance circuit and measured. If the circuit is interrupted at one point or closed, this can be detected. Corresponding electronics (loop monitoring relays) can be purchased as standard components and can be integrated into the concept presented here. In case of error detection, the entire system can be brought into a safe state via a safety PLC.

If the entire system is transported, it is possible to simplify handling by using fastening points. These fastening points serve to fix the earthing elements for transport. If the entire system is prepared for operation, the commissioning engineer must release the fastening elements manually or the system will automatically release them. In this case, the release of the fastening elements cannot be carried out at all, or not completely, or incorrectly.

It is advantageous if it has at least one fastening point for fixing an earth element during transport and this fastening point has a second loop monitoring.

Cumulatively or alternatively to the second loop monitoring, the device can have at least one fastening point for fixing an earthing element during transport, whereby this fastening point has a mechanical switch. A mechanical switch can be a pull-wire switch or a lever switch, for example. In some design variants it is advantageous if a spring is placed between the earthing and the switch.

Especially for applications in the field of railway and rail technology, it is suggested that the device has at least one wheel that is electrically conductive for rolling on a rail. This makes it possible to isolate the electrical components such as generator and converter from the towing vehicle (train, Unimog). Via a defined connection, such as in particular a cable connecting the electrical components to the train, a failure of the high-voltage insulation can be detected by means of fault current measurement.

Particularly advantageous and also essential to the invention, independently of the features described above, is a device which has a proximity lock, a proximity sensor or a target position detection for individual elements of the device, such as in particular the electrodes and the earthing.

The proximity barrier can be an access barrier surrounding at least one element.

The proximity lock may also have at least one cable pull, lever switches, one and fold-out or mobile rods or microswitches.

If the device has a proximity sensor, this may include a camera for image recognition and evaluation, ultrasonic or radar sensors.

It is advantageous if the device has a measuring device with which the position of the elements in relation to each other and/or to the ground can be measured, a position, acceleration or tilt monitoring system for the top link or for a chassis.

The measuring device with which the position of the elements in relation to each other and/or to the ground can be measured can have electrode pressure sensors, ultrasonic or radar sensors.

If the device has height-adjustable wheels and/or a height-adjustable chassis, it is possible to adjust the height position of the electrodes.

In order to be able to attach different elements to a conventional vehicle, it is advantageous for the device to have an adapter located between the attachment holder and the applicator.

It is advantageous if the high-voltage device has several modules whose power is regulated and limited. A division of the total energy by using modules reduces the energy in case of failure, which is converted in the human body. If the circuit between a positive and a negative pole is bridged or only partially bridged by the human body, only the energy of one module is available to this circuit by splitting the total energy. The basis for this is that the power of a module is controlled or limited. The modules can be designed with one or more poles on the input side. This reduces the probability of a fatal fault current.

Particularly advantageous and also essential to the invention, independently of the features described above, is therefore a device comprising several high-voltage modules with high-voltage outputs, in which at least one pole of the high-voltage outputs is bridged with the high-voltage outputs of the other modules with the same polarity in order to prevent the high-voltage modules from being connected in series.

A system may consist of several inverters connected in parallel. If there is an isolational fault to the housing of an inverter, fault location can be performed. For this purpose, a structure can be selected in which the inverter housings are installed isolated from the chassis. By using RCM technology, the faulty inverter can be identified. A distinction must be made between a fault on the low voltage side and a fault on the high voltage side.

A further advantage is the higher quality of the results regarding the biological performance of the application.

It is advantageous if a current measuring device is installed at the bypass.

It is also advantageous if the evaluation electronics have a safety relay connected in series with emergency stop switches and other partial safety units.

If a PEN conductor is used in the special case of a TN-C system, it must be ensured that it is only used for insulation monitoring in the high voltage circuit in the case of symmetrical load.

A two-pole short-circuit on the high-voltage side is not critical because in this case the system is switched off due to the overcurrent or, in the case of regulated systems, the voltage is reduced.

An advantageous further development of the method is that the measuring equipment is used to determine the ground impedance or the load impedance by measuring voltage and/or current.

In addition, the speed of the device relative to the ground can be measured and the amount of energy emitted can be determined on this basis.

A particularly advantageous variant of the method is that the weed growth is determined and, depending on this, the amount of energy emitted and/or the position of the electric harvesters can be determined.

In addition, the evaluation electronics can have a safety relay connected in series with emergency stop switches and other partial safety units.

Figure 3:
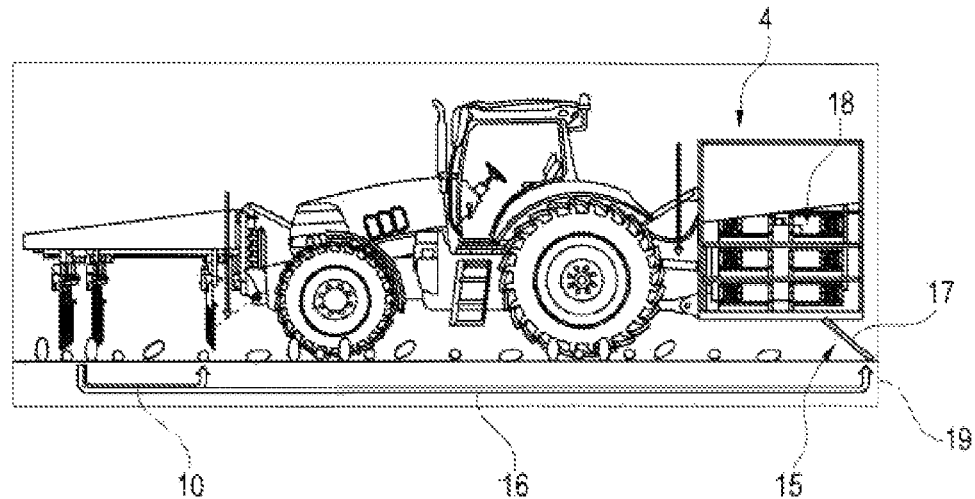
Figure 4:
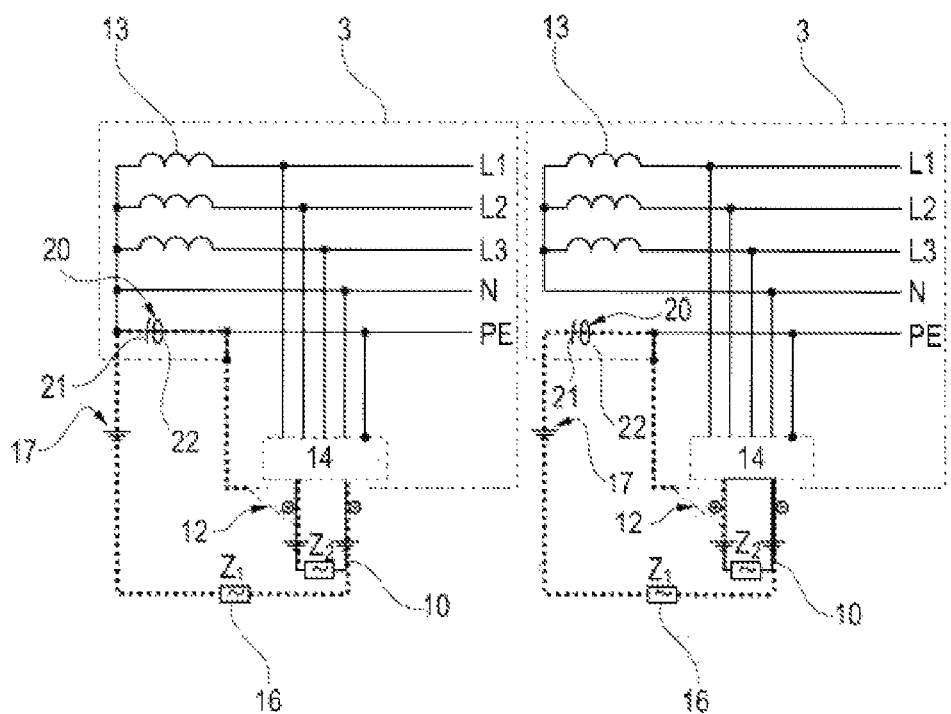
Figure 5:
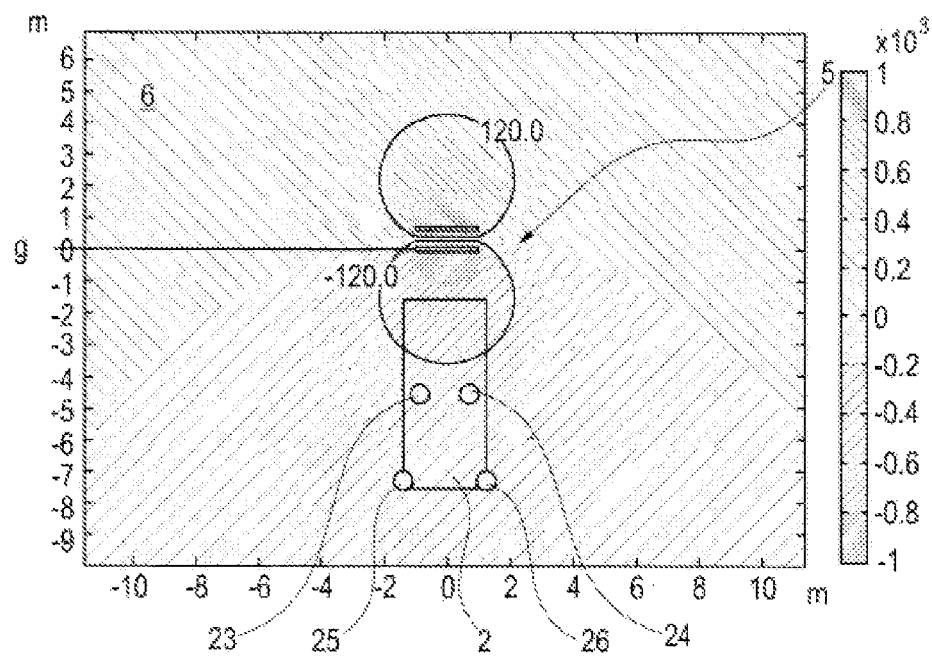
Figure 13:
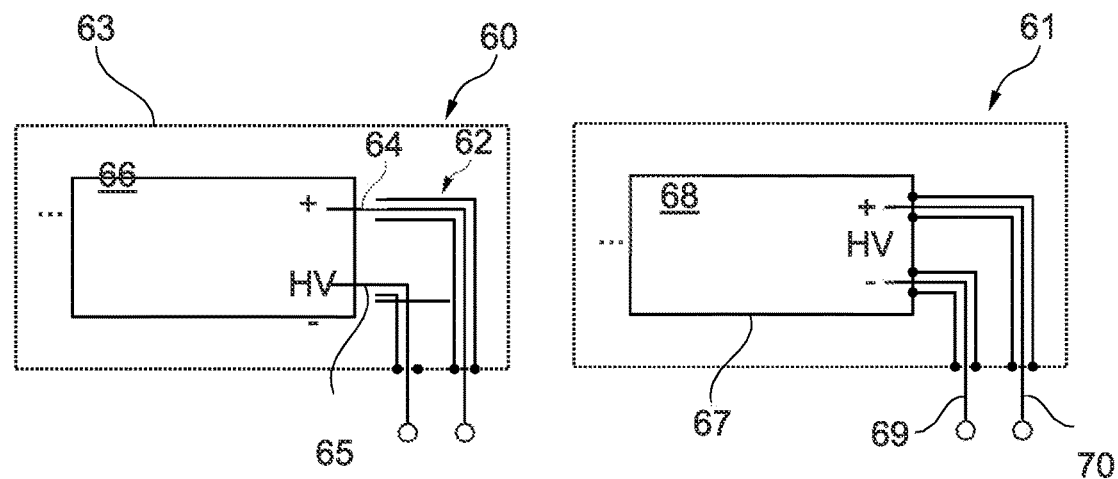
Figure 14:
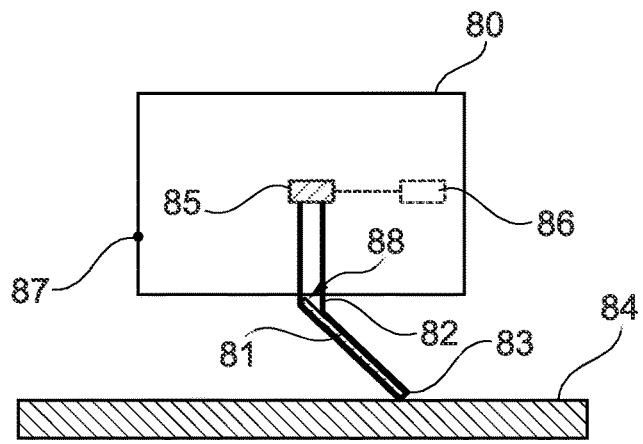
Figure 15:
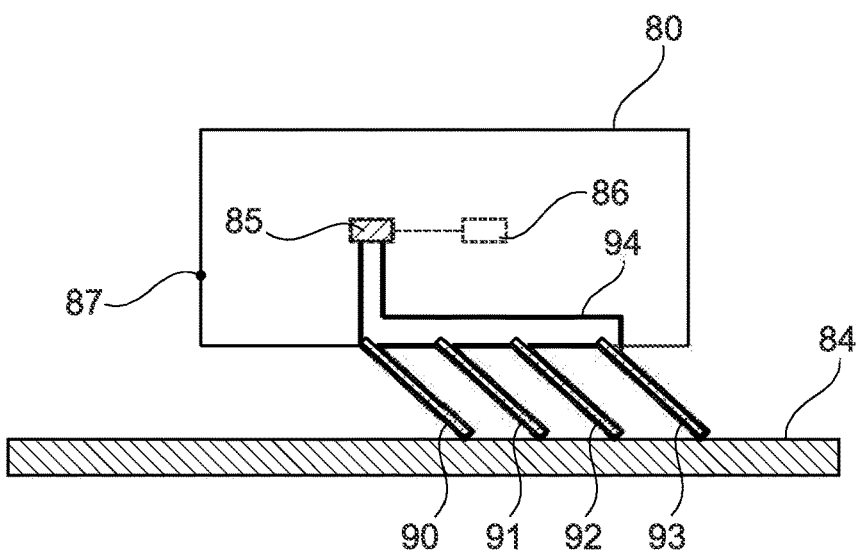
Figure 23:
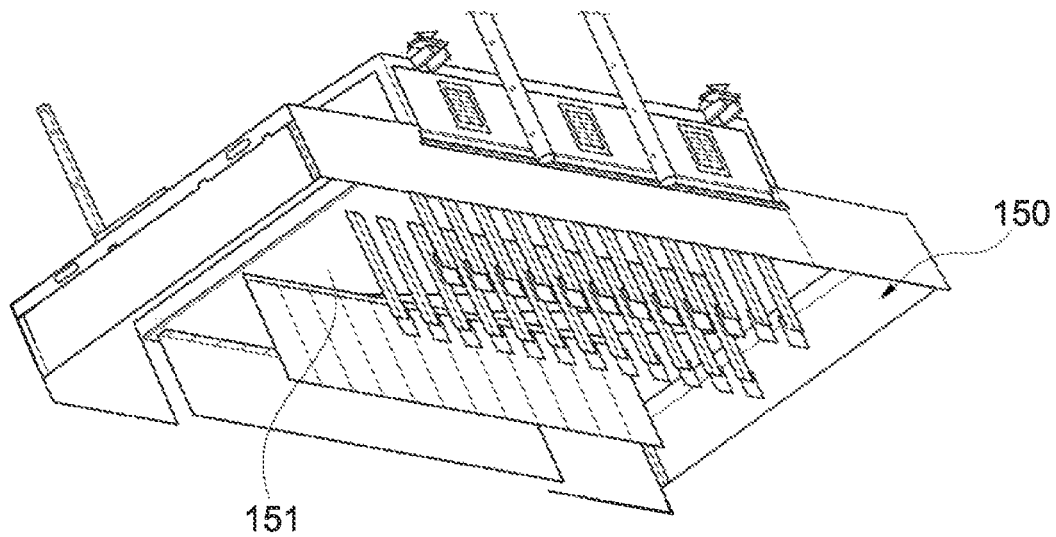
Figure 24:
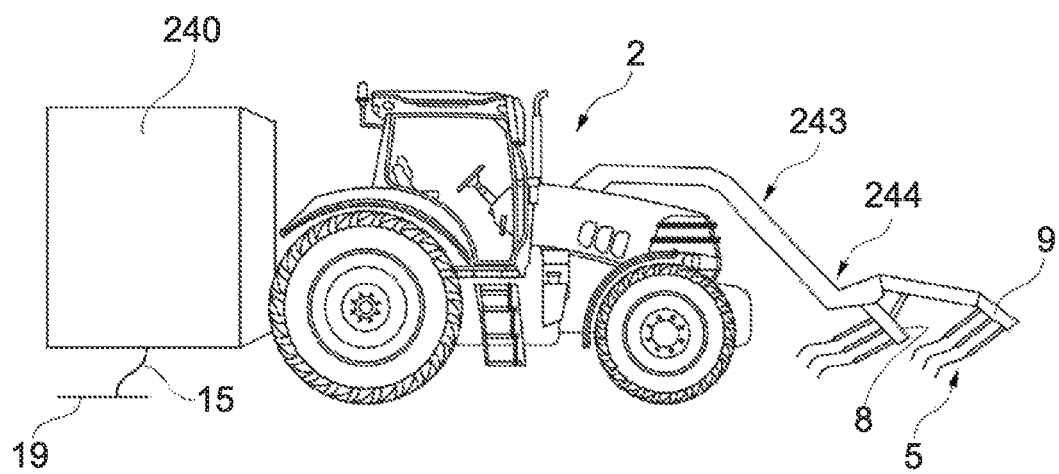
Figure 25:
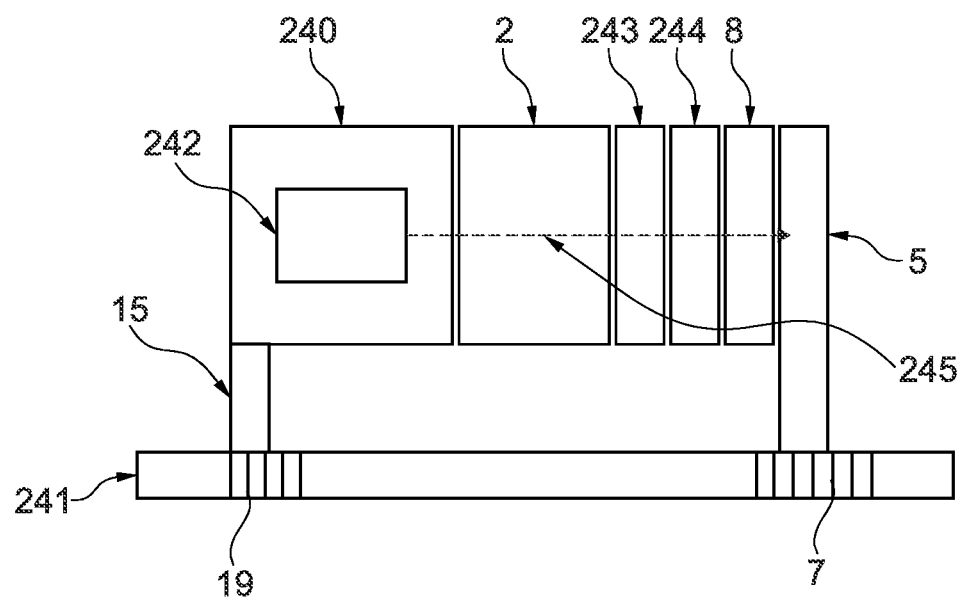
Figure 26:
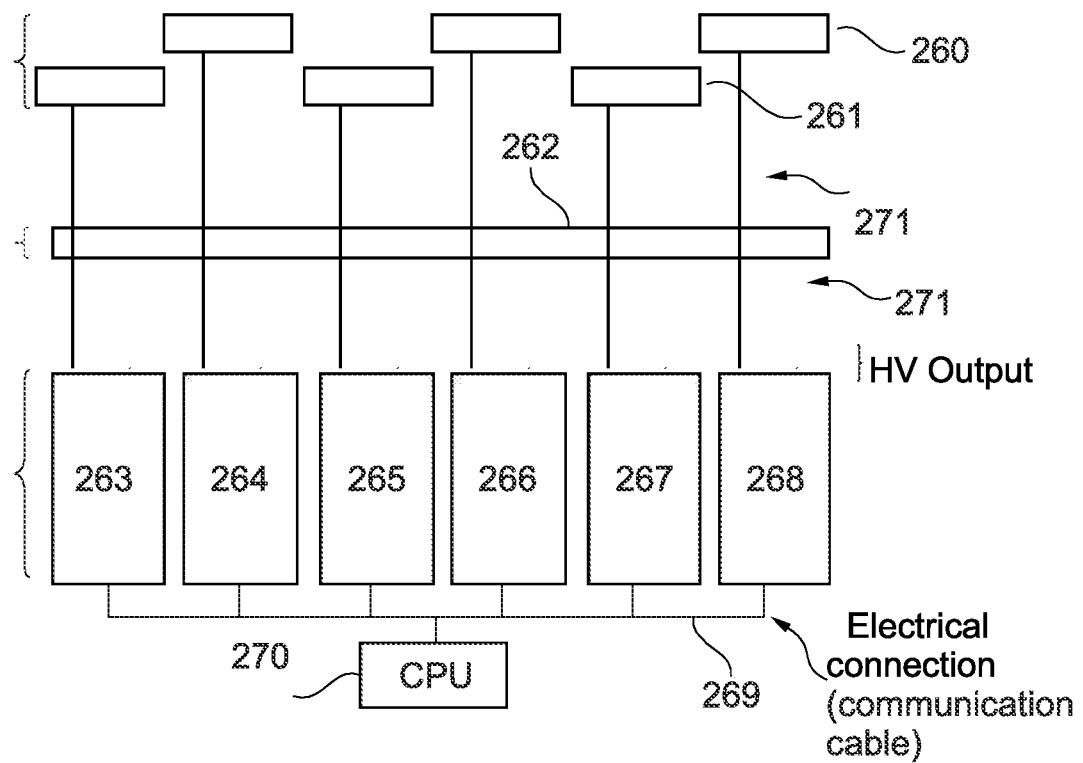

Several design examples of inventive devices are shown in the drawing and are described in more detail below. It shows FIG. 1 a tractor with ground contacting high voltage electrodes and transformers, FIG. 2 a single-pole short circuit in the TN-S system (left) and in the IT system (right), FIG. 3 shows the current division into useful current and residual current to be detected, FIG. 4 the principle of operation of residual current measurement in the TN-S system (left) and in the IT system (right), FIG. 5 shows the potential distribution on the ground surface when voltage is applied to a carrier vehicle with several earthing points, FIG. 6 a tractor with high-voltage electrodes arranged in an applicator room, FIG. 7 shows the division of a residual current into a detectable and a non-detectable part, FIG. 8 the electrical insulation of the underside of the vehicle and the attachments, FIG. 9 shows the potential distribution on the ground surface with applied voltage and wing arrangement of the high voltage electrodes, FIG. 10 a circuit for the detection of residual currents, FIG. 11 shows a circuit for using RCM technology to detect low-voltage insulation faults, FIG. 12 an arrangement for detecting insulation faults on the high voltage side, FIG. 13 two arrangements for insulation against the chassis, FIG. 14 schematically shows the structure of a loop monitoring system, FIG. 15 shows a wiring diagram when using several earthing elements, FIG. 16 an assembly or disassembly supervision, FIG. 17 the fixing of grounding points for transport, FIG. 18 Loop monitoring as fastening monitoring, FIG. 19 is another possibility for transport securing, FIG. 20 the use of wheels as earthing elements or as return conductors, FIG. 21 the use of more than one support wheel, FIG. 22 an electrical connection between the wheels, FIG. 23 the isolation of an application room, FIG. 24 shows the individual elements of the system using a tractor as an example, FIG. 25 schematically shows the individual elements of the system, FIG. 26 shows a distribution of the total energy over modules, FIG. 27 Earth and residual current measurements in railway applications, FIG. 28 an increase in efficiency through the use of rail in railway applications, FIG. 29 an insulation of the power supply system against the vehicle chassis, FIG. 30 four concepts to isolate the electrodes from the rest of the system, FIG. 31 Hazardous areas around the application area FIG. 32 an extendable side guard, FIG. 33 a protection with rope and pull switch, FIG. 34 a positioning of the frame with tilt sensors, FIG. 35 a device for recording the electrode status, FIG. 36 a circuit for determining the biological effect of the device and FIG. 37 a device for measuring the frame height.

The device 1 shown in FIG. 1 consists essentially of the carrier vehicle 2 with its chassis 3, a high-voltage device 4 and high-voltage electrodes 5. This device 1 serves to treat the soil 6, whereby the high-voltage device 4 generates a high voltage which is introduced via the high-voltage electrodes 5 into a first soil area 7. Since the electrodes 8, 9 (only numbered for example) are differently polarized, a useful current 10 is generated between them in the first soil area 7, which causes an impairment or even prevention of the growth of plants 11 (only numbered for example).

With such arrangements, a single-pole short circuit 12 can occur between the high-voltage electrodes 5 and the chassis 3, as shown here between the applicator 9 and the carrier vehicle 2.

Figure 2:
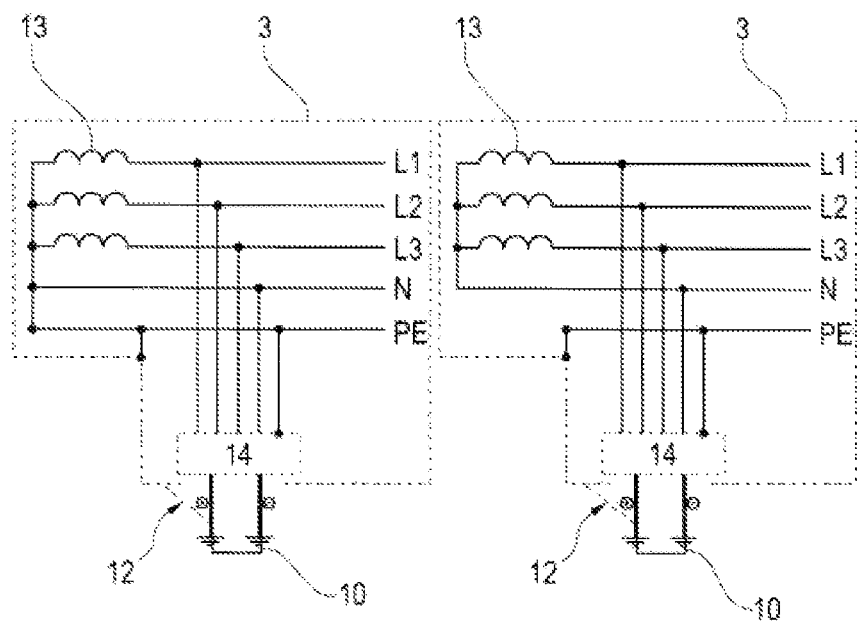

Using the example of a TN-S system and an IT system, FIG. 2 shows that no residual current can be detected in the case of such a single-pole short circuit 12. Even though the RCD technology normally used and the IMD technology, which detects residual currents on the low-voltage side, are not active for short-circuits on the high-voltage side.

In detail, FIG. 2 shows a generator 13, a chassis 3, a transformer 14 and the useful current 10.

The system shown in FIG. 3 corresponds to that shown in FIG. 1, but with an earth 15. In addition, FIG. 3 shows the division between the useful current 10 and the residual current 16. For this purpose, an earth chain 17 extends from the high voltage device 4 with the transformers 18 to a second floor area 19. The residual current measurement 20 consists of a measuring device 21, which measures the earth current, and an electronic evaluation system 22.

FIG. 5 shows the resulting voltage funnel using an example with DC voltage. The electrodes have electrical potentials of +/−1 kV, a distance of 0.5 m, a contact area of 0.2 m² (2 m×0.1 m) and the contact resistance is not considered. By means of equipotential lines the limit values+/−120 V are shown in each case. The lower edge of the negative electrode (−1 kV) is located at the y coordinate 0 m. The distance between the applicator 9 and the grounding on the carrier vehicle 2 should be at least about 3.5 m in this example. For this reason, several grounding points 23 to 26 with spatial distribution were provided at a distance from the high-voltage electrodes 5 on carrier vehicle 2.

Figure 6:
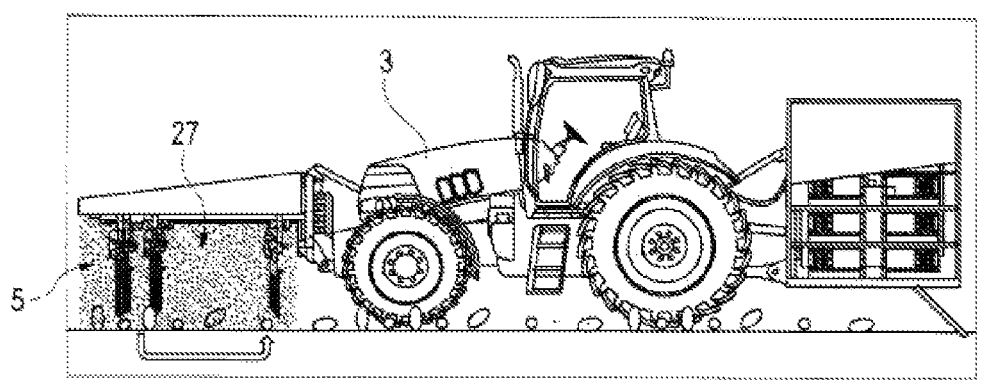
Figure 7:
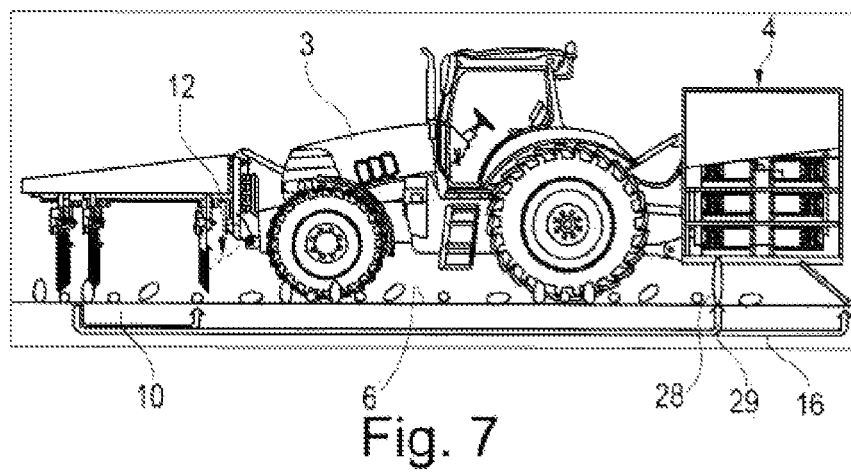

FIG. 6 shows how the electrodes 5 are arranged in an insulated applicator compartment 27. This prevents a single-pole short circuit between the high-voltage electrodes 5 and the chassis 3 of the carrier vehicle 2.

FIG. 7 shows the detectable residual current 16 in addition to the useful current flow 10. High ground vegetation 28 can lead to a current 29 between the ground 6 and the chassis 3 or the high voltage equipment 4 that cannot be detected by the residual current measurement 20.

Figure 8:
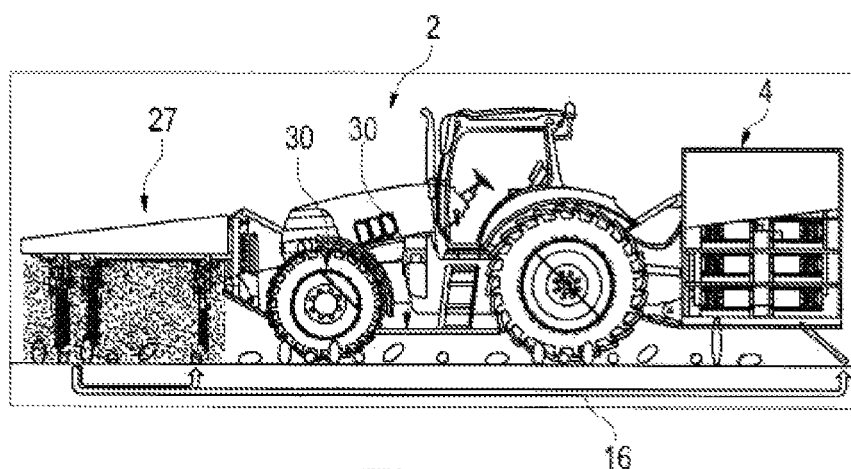
Figure 9:
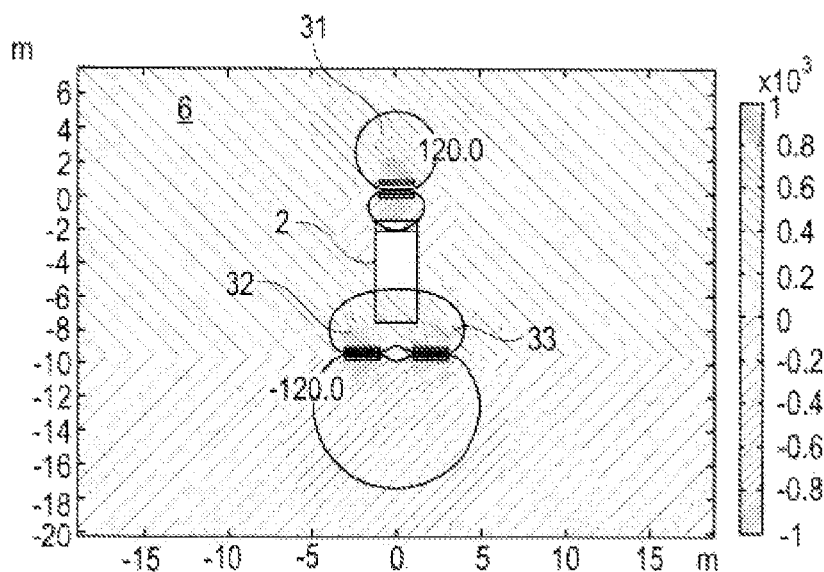

Therefore, FIG. 8 shows an electrical insulation 30 on the underside of the carrier vehicle 2, which extends from the applicator compartment 27 on the underside of the carrier vehicle 2 to the underside of the high voltage device 4. As a result, there is no longer an undetectable current 29 and the entire residual current 16 is detectable.

FIG. 9 shows the potential distribution on the floor surface with applied electrical potentials of +/−1 kV, showing the introduction of high voltage into the floor 6 with high voltage electrodes 31 in front of the carrier vehicle 2 and high voltage electrodes 32, 33 to the side of the carrier vehicle 2 as a wing arrangement. Earthing elements can be mounted at any position and can be used as spacers or distance signalling. The earthing elements can also be used as field control electrodes for step voltage reduction.

Figure 10:
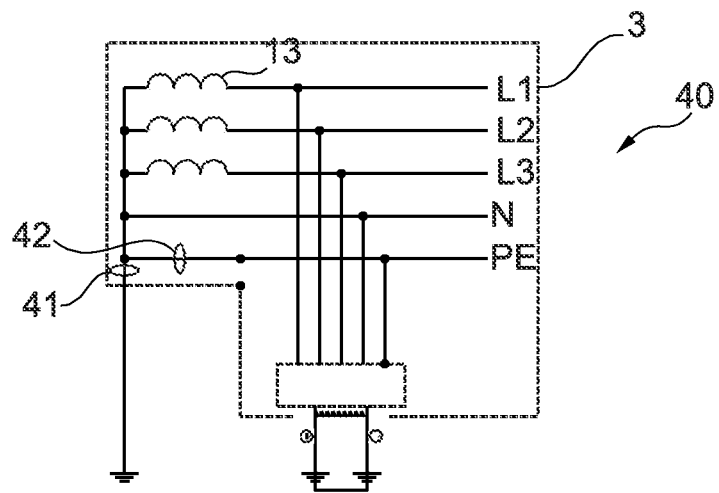
Figure 11:
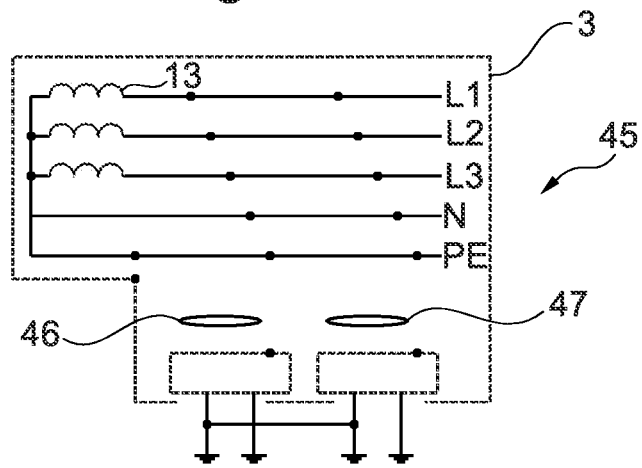

Positions 41 and 42, for example, can be used to detect the residual currents in the circuit 40 shown in FIG. 10. Position 41 can be used to record other leakage currents in addition to the pure isolation error measurement. Every signal of an insulation fault must lead to a safe shutdown of the entire system. For the exclusive detection of residual currents, a filter (e.g. capacitive, not shown) can be connected in parallel to the residual current measurement. This filter can be used to separate residual currents and operationally induced leakage currents in order to ensure that the residual current detection is not interrupted during operation.

FIG. 11 shows in circuit 45 the use of RCM technology for detecting low-voltage insulation faults when using several inverters in a TN system. Sensors 46 and 47 can be designed to be sensitive to universal current.

Figure 12:
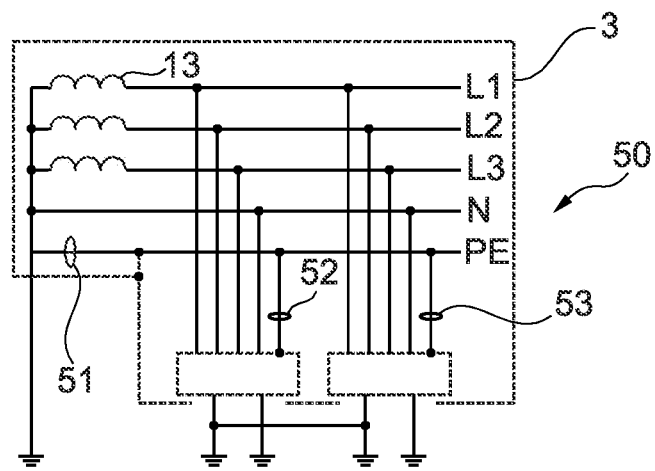

FIG. 12 shows an arrangement 50 for detecting high voltage insulation faults. As described above, sensor 51 is used to detect insulation faults between the HV output of the inverters and the chassis. Sensor 52 and sensor 53 are used to locate insulation faults between the HV output and the chassis of the inverter and are similar to sensor 51. Sensor 51 also triggers for this type of fault. If only sensor 51 triggers, it can be assumed that the fault is outside the inverter. If only one inverter is used, a distinction can be made between a fault on the inverter and a fault in the rest of the system.

Both fault detection measures (LV detection, HV detection) can be installed in parallel.

When using more than one inverter, always bridge one pole to prevent series connection of inverters. This series connection would generate unacceptable potential increases in the system and could lead to material damage. A series connection can occur when a negative output of one inverter is connected to a positive output of another inverter and can be caused, for example, by metal objects on the substrate.

An HV shielding of the HV cables on both sides would violate the requirements for fault location. If shielding is used (e.g. for EMC reasons), it must be connected on one side to ensure insulation between the inverter housing and the chassis. The side that is not connected must be designed with high-impedance insulation from the chassis/inverter housing. Here, you can basically choose between the two arrangements 60 and 61 shown in FIG. 13:

If the HV shielding 62 is connected to the chassis 63, a distinction can be made between an HV insulation error of the cable 64, 65 compared to an internal HV insulation error of the inverter 66. The faulty cable cannot be identified.

When using a one-sided support on the chassis 67 of the inverter 68, the faulty inverter 68 including cable 69, 70 can be identified in case of a HV insulation fault. It is not possible to distinguish whether the fault is in inverter 68 or in one of the cables 69, 70.

Since a loss of the grounding elements or incorrect commissioning can result in the chassis not being grounded, the following describes a monitoring of the grounding.

FIG. 14 shows the schematic structure of loop monitoring. Here the rear frame of FIG. 1 is shown schematically as chassis 80. In principle, however, the concept can be integrated at any point of the device. A cable 82 (or an electrical conductor/return conductor) is laid parallel to the earthing element 81, which is electrically insulated from the earthing element 81. Only at the point 83 where the earthing element touches the ground 84 (or as close as possible to the point) is the cable 82 electrically connected to the earthing element 81. This ensures that even a partial loss of the earthing element 81 is detected. In the event of a fault, the closed circuit is interrupted and the electronics of the loop monitoring system 85 reports a fault to the PLC of the second loop monitoring system 86, which can then switch off the high voltage at the electrodes and bring the system into a safe state. There is only a single electrical connection 87 to the chassis 80, and electrical insulation 88 is provided at the passage of the cable 82 through the chassis 80.

FIG. 15 shows a possible connection when using several grounding elements 90, 91, 92, 93. To do this, the grounding elements are connected in series. This ensures that any loss of any earthing element interrupts the earth loop 94 and fault detection takes place. In principle, a parallel connection is also possible.

Figure 16:
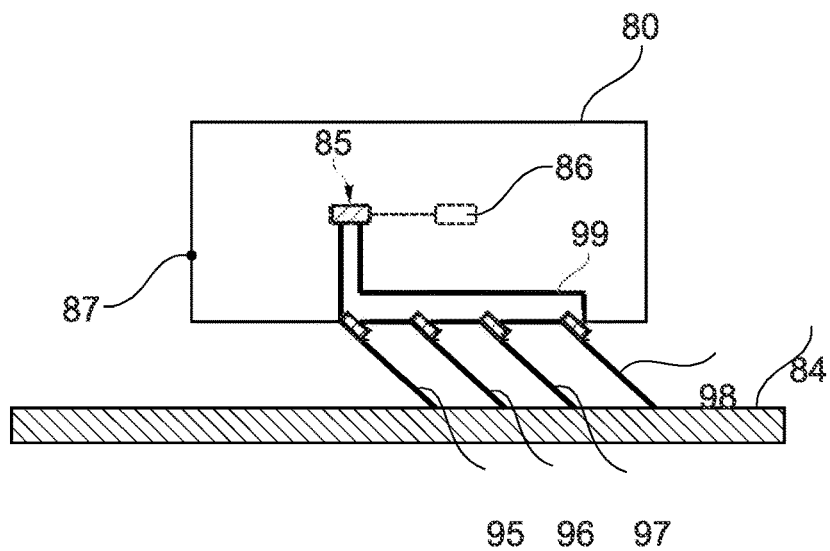

If no loss of the earthing element is to be expected, installation or removal monitoring can be carried out in the same way as shown in FIG. 16. The connection between earthing element 95, 96, 97, 98 and the cable 99 serving as return conductor can be made near the frame of chassis 80.

Figure 17:
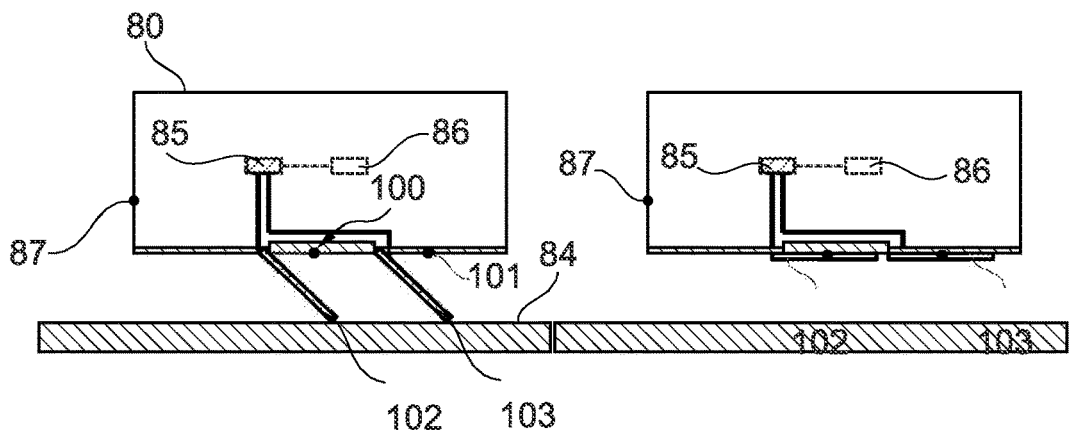

FIG. 17 shows how handling can be simplified by using fixing points 100 and 101 which are insulated from the chassis. These mounting points 100, 101 are used to fix the grounding elements 102, 103 for transport. If the complete system is prepared for operation, the commissioning engineer must release the earthing elements 102, 103 manually or the release is performed automatically by the system. In this case, the release of the fixings cannot be carried out at all, or not completely, or incorrectly.

Figure 18:
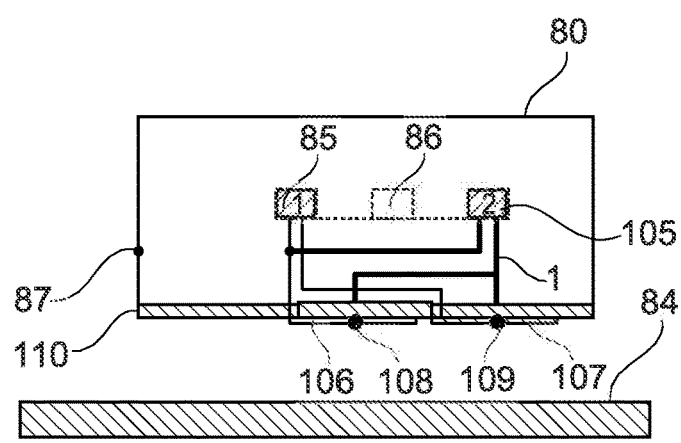
Figure 19:
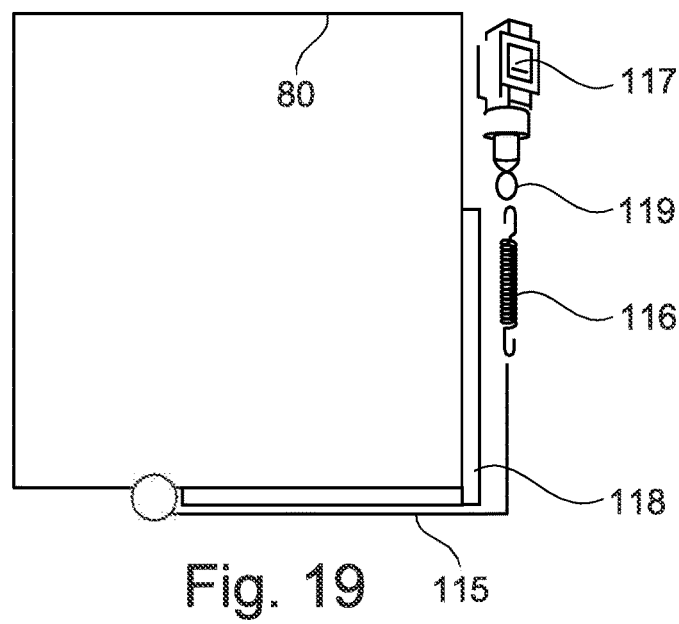

FIG. 18 shows a first loop monitoring 85 and a second loop monitoring 105 as attachment monitoring to monitor the attachment of the earthing elements 106 and 107 at attachment points 108, 109. For this purpose the fixing points 108, 109 are electrically insulated from the chassis 80 with insulation 110. When in use, the fixing points 108, 109 are electrically connected to the earthing elements 106, 107 and they are located at a sufficient distance from the suspensions (not shown) of the earthing elements to prevent an electrical connection between them (in case of non-fixed earthing elements). The fixing points 108, 109 can basically be installed at any position on the chassis 80 frame. Multiple attachment points 108, 109 are connected in parallel to ensure that all attachment points are properly released. The attachment points do not need to be located at the bottom of the frame.

If the entire system is started up without error, no quiescent current flows in the second circuit 111. If the grounding elements are in the fixation, a quiescent current flows in the second circuit and the entire system cannot be started up. In the event of a fault, the SPS 86 receives a message from the electronics of the second loop monitoring system, which prevents commissioning.

The monitoring circuits operate independently of each other and can be used individually. It must be ensured that a connection 87 to chassis 80 exists in each case.

Another possibility of transport protection with monitoring is shown in FIG. 19. In this case, the earthing element 115 is manually connected for transport via a spring element 116 (optional) to a fixing point 119 of a pull-wire switch 117 or a lever switch.

If the entire system is to be prepared for operation after transport, the earthing element 115 must be separated from the spring element 116 or the switch 117 manually or automatically. If this is not done or is done incorrectly, this is detected by switch 117 and forwarded to a programmable logic controller 86. This can then prevent the entire system from starting up and provide the operator with an error message and/or instructions for action. The attachment of the earthing element 115 via the pull-wire switch 117 should be the only possibility to attach the earthing element 115.

Figure 20:
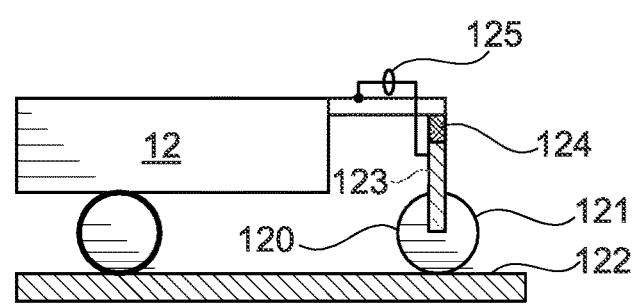

FIG. 20 shows how the wheels 121 can be used as earthing elements or as return conductors (or electrodes). The surface 120 with which the wheel 121 touches the ground 122 has an electrical connection to the chassis 123 (with slip ring contacts if necessary). The chassis 123, which is in electrical connection with the wheel 121, has a high voltage resistant insulation 124 to the frame of the chassis 126. This insulation 124 is designed according to the highest voltage occurring in the system. The wheel 121 can have a profile for better electrical and mechanical connection to the floor 122. During construction, creepage distances and clearances in accordance with standards must always be observed. The insulation 124 is bridged by a residual current measurement 125.

Figure 21:
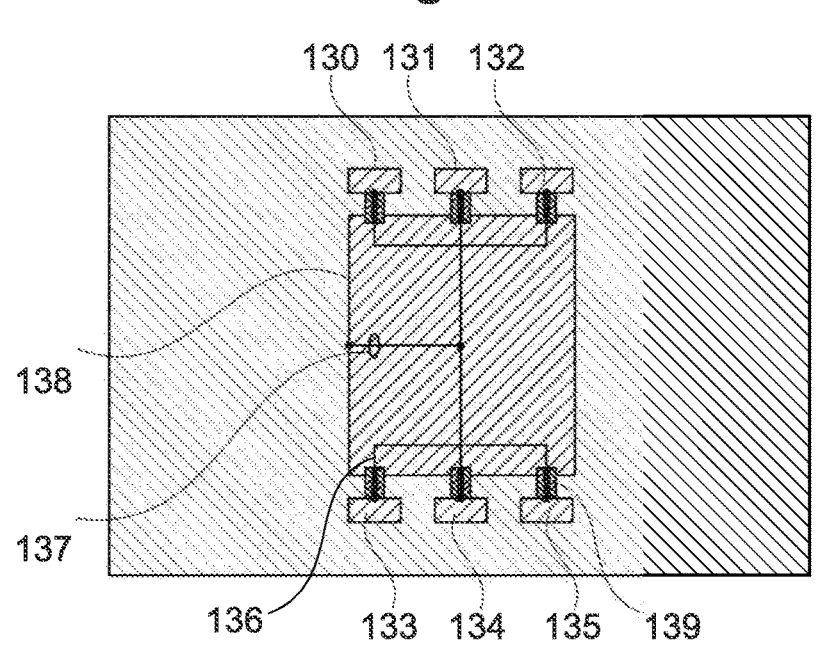

FIG. 21 shows how a wiring of the equipotential bonding cables or earthing cables 136 can be set up if more than one support wheel 130 to 135 is used. This allows current to flow between support wheels 130 to 135 without triggering a residual current monitor. The wheels are connected in parallel. There is only a single connection 137 to the frame or chassis 138. The residual current can be detected through this connection. The potential cables and earth cables 136 are insulated against the chassis 138 via insulation sleeves 139 (only numbered as an example).

Figure 22:
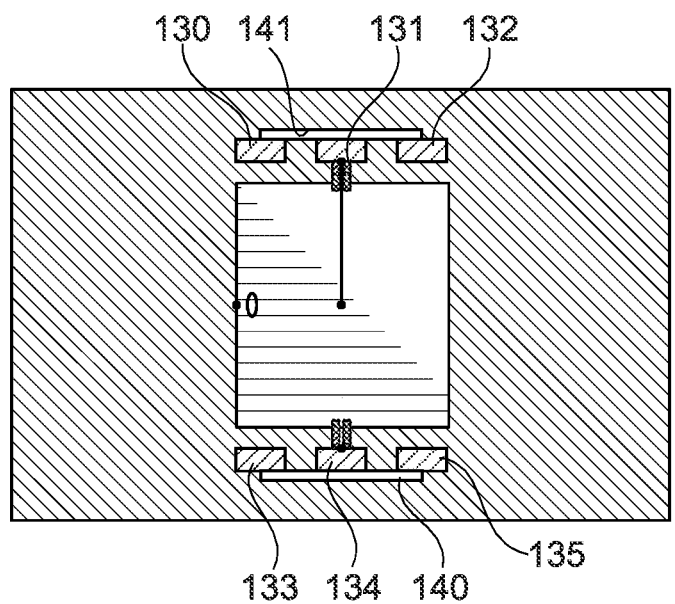

If there is an electrical connection between the wheels 130 to 135, e.g. via chassis 140, 141, the cabling effort can be reduced as shown in FIG. 22.

High-voltage-resistant plastic can be used to insulate application room 150 from the frame of chassis 3. FIG. 23 shows how a plastic assembly 151 can be designed in such a way that there is no direct connection between the application area and the rest of the machine, especially Chassis 3. Air and creepage distances are maintained. All mountings are blind holes. Should the wiring be damaged or even torn off by vibrations or plants, the fault remains in the high voltage range.

As a further safety measure to avoid non-permissible electrical potentials on the frame of chassis 3, the entire front frame can be constructed of non-conductive material (e.g. GRP). For vehicles, the entire chassis can be constructed from non-conductive material (e.g. autonomous vehicles).

In FIGS. 24 and 25 you can see the grounding 15 between a platform power supply 240 and the floor area 19 of floor 241. The platform power supply 240 is designed for a power class indicating how many electrodes can be connected and contains the housing 242 of the electrical components (generator, HV modules, HV cable shield). The carrier vehicle 2 has a receptacle 243 for attachments with an adapter 244 which holds the applicators 8, 9 to which electrodes 5 are attached. The mounting 243 for attachments is a mechanical device that carries the applicators 8, 9 and connects them to the carrier vehicle 2. The adapter 244 is a mechanical device used to adapt a conventional carrier vehicle 2 to special applicators 8, 9. An applicator 8, 9 is a mechanical device that carries at least one electrode 5. An electrode is a part carrying high voltage and is arranged to contact a plant or soil area 7 when using the device.

The HV cable 245 runs from the housing 242 via the carrier vehicle 2, the receptacle 243, an adapter 244, applicators 8, 9 to the electrodes 5.

Insulation may be placed between each of the elements shown in FIG. 25. Multiple insulation can be monitored by a voltage measurement. A defined, monitored electrical connection for fault current measurement can also be arranged between the elements. Finally, an electrical connection without monitoring can also be arranged between the elements.

FIG. 26 shows how a distribution of the total energy via modules reduces the energy that is converted in the human body in the event of a fault. For this purpose, a first and a second row of electrodes 260 and 261 with plus electrodes and a bridged second row of electrodes 262 with minus electrodes are connected via high-voltage cable 271 as electrical connections to the high-voltage output of modular, limited and regulated high-voltage generation modules 263 to 268. The modules are in turn connected to a CPU 270 via communication cable 269 as electrical connections.

If the circuit between a positive and a negative pole is bridged or only partially bridged by a human body, the energy of only one module is available to this circuit by dividing the total energy. The basis for this is that the power of a module is controlled or limited. The modules can be single-pole or multi-pole on the input side. This reduces the probability of a fatal fault current.

A further advantage is the higher quality of results with regard to the biological performance of the application. To avoid the high inrush current when all modules are switched on at the same time, they can be switched on with a time delay. For practical reasons, the time delay should be small so that the untreated surface remains small during the switch-on process (system is in motion). Ideally, all modules should be switched on after 1 s.

Figure 27:
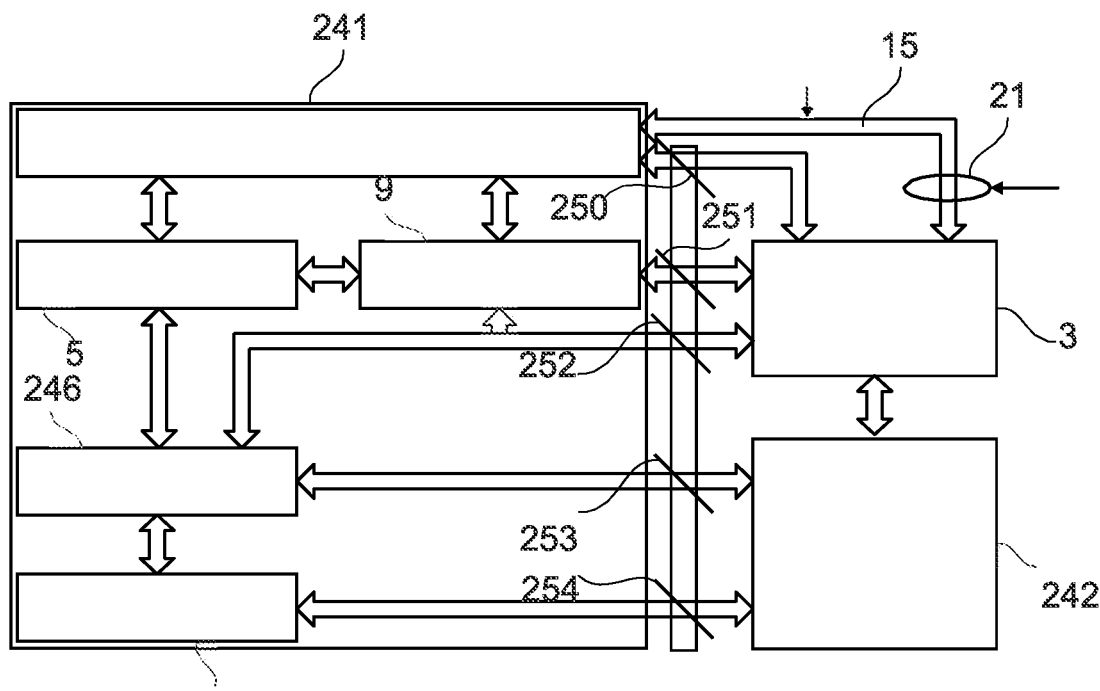
Figure 28:
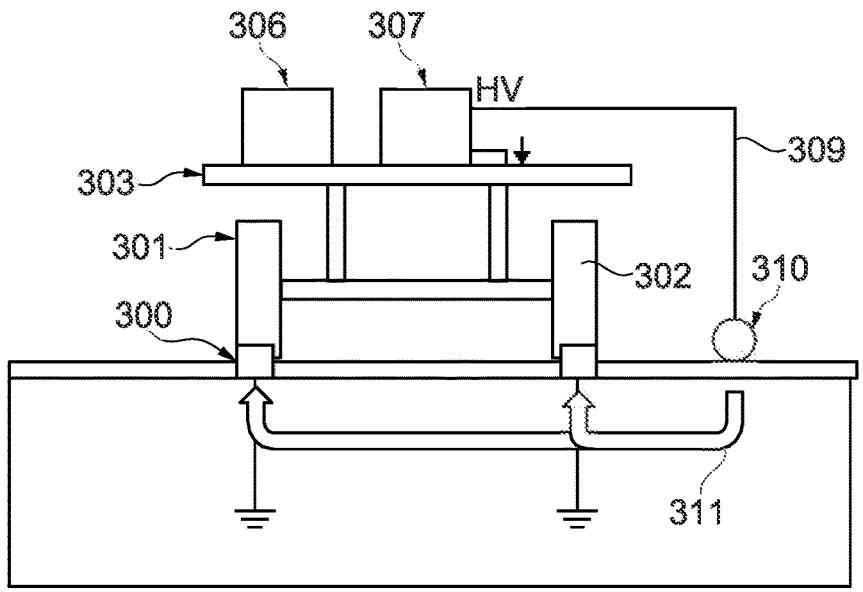

The structure shown in FIGS. 27 and 28 is used to detect fault currents in railway systems. For this purpose, the electrical system is connected to the chassis at a defined point in order to perform the residual current measurement. The chassis is connected to the chassis from the generator. The HV cables are shielded and coated for fault detection.

By using the rails 300, the wheels 301 and 302 running on them and the chassis 303 as return conductor, the biological performance can be increased by reducing the impedance the gensets are confronted with. The power units always have a grounded output. An insulation fault can be detected by short-circuit detection.

The figures show a residual current measuring device 304, a grounding 305, a generator 306, a voltage generator 307, an electrical insulation 308, shielded and insulated high voltage cables 309, electrodes 310 and the electrical current 311.

Figure 29:
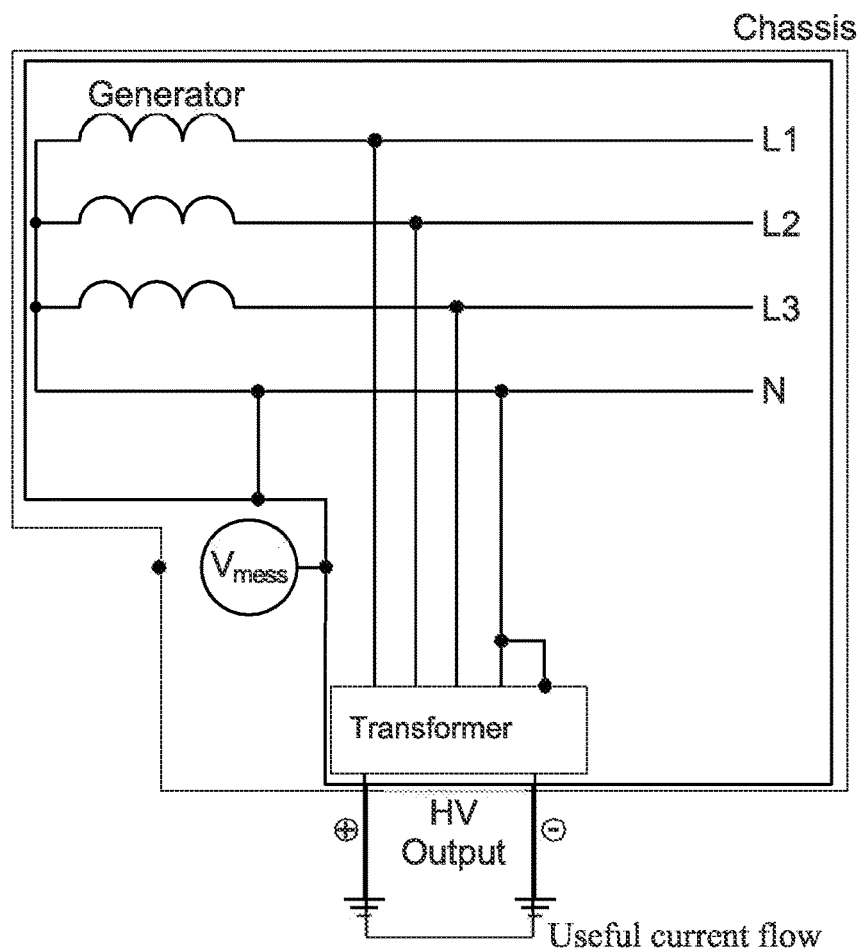

To detect insulation faults between the HV output and a fully insulated system, a voltage measurement (Vmess) is used, which is designed for the maximum voltages present in the system. FIG. 29, which shows this, corresponds essentially to FIGS. 2 and 4 and also shows voltage measurement 325. Any signal of an insulation fault should result in a safe shutdown of the entire system. Since the isolated system can be charged up to a high AC voltage by capacitive coupling, the entire system must be designed for the highest system voltage. For personal protection an RCD can be used near the generator (topology independent). There is no need to connect the star point to the PE.

To create a further, third insulation level, the chassis of the attachment can be designed insulated from the chassis of the carrier vehicle. The housing of the components and the device can be designed to be touch-proof to increase the protection against accidental contact. The applicator is connected to the device.

Figure 30:
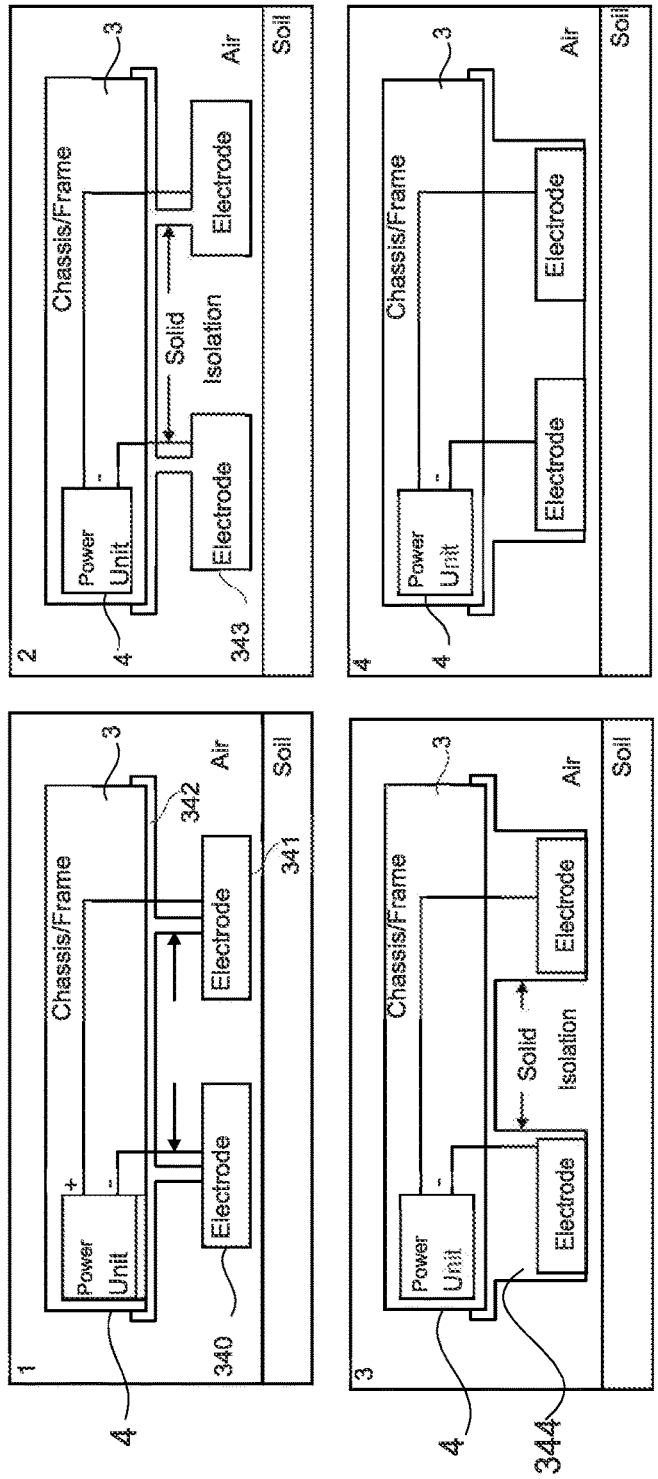

Further improvements concern the insulation of the electrodes. In FIG. 30, four concepts are presented for isolating the electrodes from the rest of the system. These four concepts differ in the arrangement of high voltage solid insulation and air gaps. Due to the possible transmission via the ground (vegetation), a solid insulation (basic insulation) of the entire chassis/frame is always shown. In principle, systems can also be set up without basic insulation if constructive measures prevent this contact.

The first concept (1) is limited to a purely mechanical fixation of the electrodes 340, 341 via a HV solid insulation 342. Between electrode and chassis there are only the basic insulation and the air gaps, which are designed according to the voltage and the degree of pollution. This insulation arrangement is weak as soon as the base insulation is omitted.

The second concept (2) additionally includes a solid insulation 343 around the electrodes. Depending on the geometry, this arrangement has the advantage that the air gaps can be shorter.

The third concept (3) completely dispenses with the design of the air gaps between the electrodes and the chassis in favor of a further solid insulation 344. This can increase the complexity of the system.

The fourth concept (4) involves the complete integration of the electrodes into a solid insulation 345 (except underbody). The disadvantage is that the tangential boundary layer (solid insulation vs. air gap) between the electrodes is a weak point of the system.

Another problem is the danger of direct human contact. For this purpose, a proximity lock is presented first.

Figure 31:
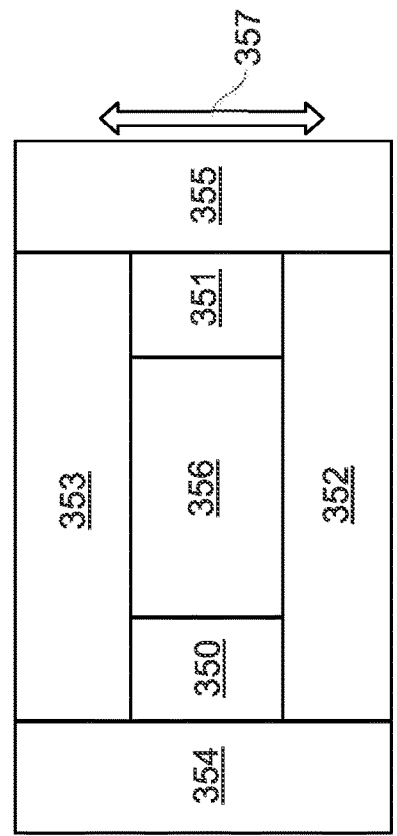

A safety distance is defined by the condition that the electrodes cannot be touched during operation, i.e. that nobody may approach the high voltage area. In addition, the potential distribution in the ground has an influence on the step voltage. However, far away from the range of application, this is so small that no further monitoring or switch-off is required. FIG. 31 shows a first danger zone 350, 351, a second danger zone 352, 353 and a third danger zone 354, 355, which are arranged around the application area 356 in the direction of movement 357. The second danger zone 352, 353 results from the consideration that there is intuitively no body in front and behind the front frame in the driving system, because the driver is obvious from the moving carrier vehicle. This area is therefore monitored by the driver and is not additionally blocked. Since the density of the equipotential bonding lines is highest in most applications on the side of the front frame in the ground and direct contact with the electrodes cannot be excluded, the first danger area 350, 351 can be defined accordingly. The three danger zones apply to every area of application of a machine. It is not necessary to install an emergency stop switch near this application area, which is located in the first or second danger zone. The third area should also not be entered in case of danger.

Figure 32:
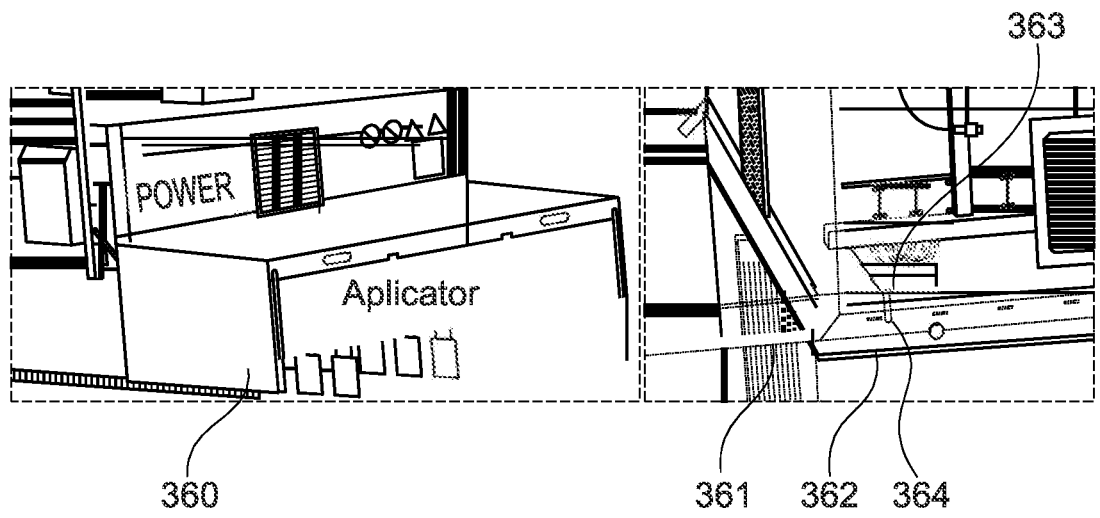
Figure 33:
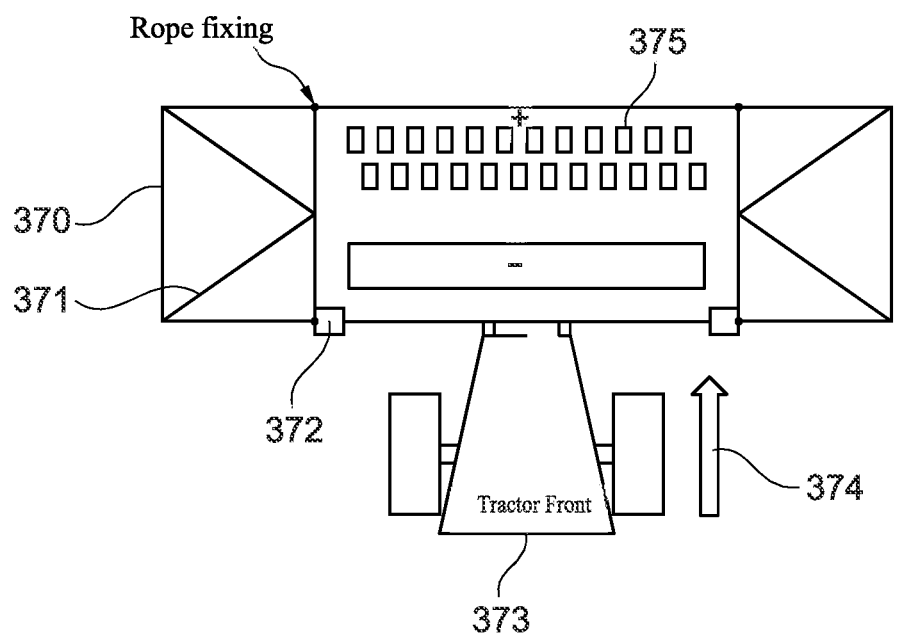

FIG. 32 shows the implementation of the blocking of the first danger zone 350, 351 by a retractable side guard 360 (the side guard is extended in the figure). The danger zone can only be demarcated if there are no tall plants in this zone (e.g. orchards, vineyards). The barrier consists of at least one boom 361, which can be pushed into the frame 362 or folded for transport. In addition, redundantly designed sensors 363 with magnet 364 can be used to detect and report the status (retracted or extended), e.g. to a safety PLC. At least level C in the safety evaluation can be achieved. The frame 362 can be covered with at least one mat.

Figure 36:
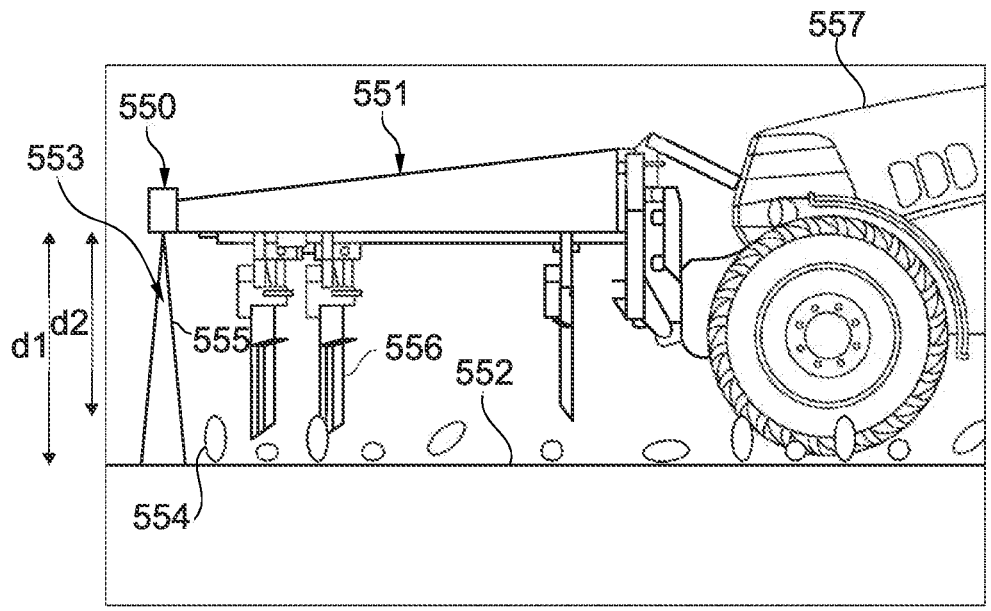

A further possibility to seal off the first danger zone 350, 351 is to use at least one rope 370 in combination with a linkage 371 and at least one rope pull switch 372. This is shown in FIG. 36 on a tractor front 373 moving a front frame 375 in driving direction 374.

Ensuring that the electrodes are in plant or earth contact during operation is another obstacle that makes it difficult to touch the electrodes during operation. In order to guarantee the safety precautions of the attachments independently of the carrier vehicle, several combinable solutions are presented as target positioning. The high voltage can only be switched on if the sensor(s) confirm the target position of the electrodes. If the target position of the electrodes is left during operation, the high voltage is switched off.

A top link position monitoring device has a connection to both the top link and the front frame. A sensor is switched when the front frame is in the target position by means of a frame which adjusts itself depending on the angle between the two elements. A torsion spring can permanently press the mechanism towards the tractor against a stop which is fixed in a longitudinal groove. A coded RFID sensor with level D clearance can be placed at the outermost point of the mechanism. A second arm can also be rotatable mounted on the mechanism. The actuator is located at the outermost point of this arm. For example, the arm is attached to the top link of the tractor with a rubber band so that it moves when the linkage moves from the tractor. Alternatively, other switches can be used.

The top link position monitor then has at least one connection to the top link and the frame of the application. Optionally, it has at least one spring and a movement mechanism that adjusts itself depending on the angle between the upper link and the frame. The top link position monitor also has at least one micro-switch or travel sensor that detects the target position. In principle, this arrangement can be mounted at any point in the overall system that is suitable for it.

A frame can also be positioned with the aid of tilt sensors. In principle, it is possible to use only one (or several independent sensors to achieve redundancy). However, this concept only works reliably if the ground has no inclination, since a change in the inclination also changes the inclination of the sensor.

Figure 34:
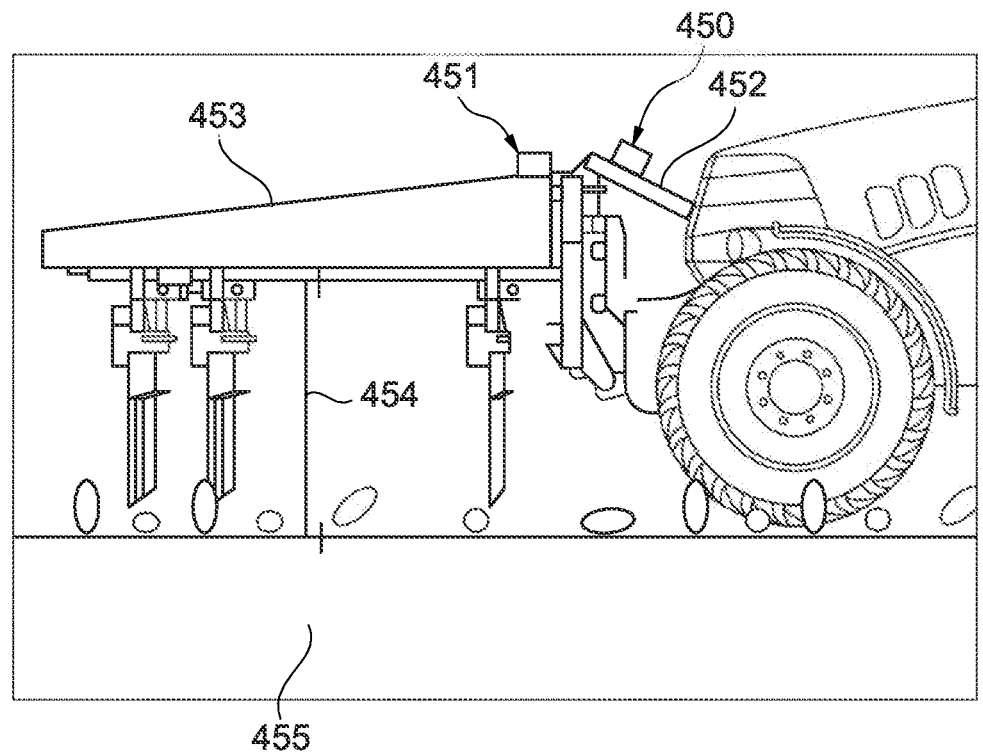

To solve this problem, at least two inclination sensors 450, 451 can be attached to different parts of the structure, whereby the difference in the angle of inclination is evaluated. FIG. 34 shows one sensor 451 on frame 453 and one sensor 450 on top link 452. As the angle of the two attachment points changes depending on the frame position, a defined angle difference can be used as a setpoint for frame height 454 independent of the ground 455.

Figure 35:
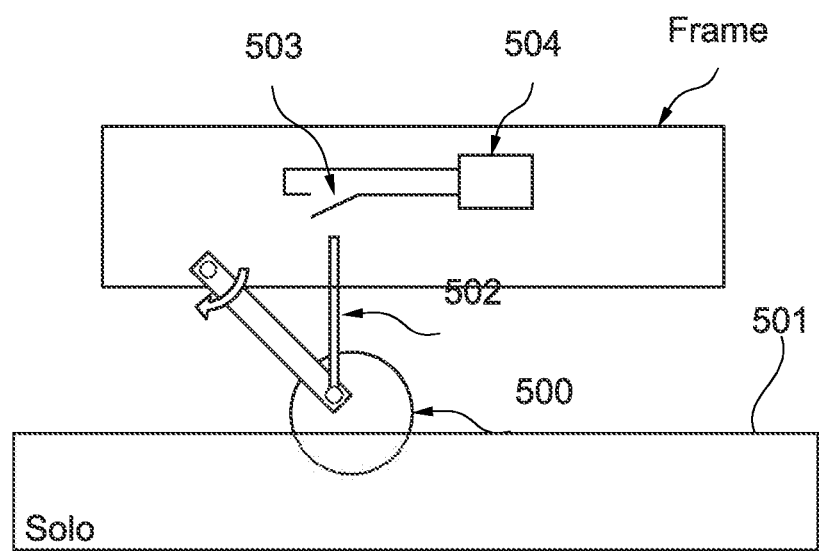

FIG. 35 shows a device for detecting the electrode status to determine the position of a moving electrode. The electrode 500 is mounted on a suspension (not shown) which allows the electrode 500 to move. The position of the electrode 500 depends on whether the electrode 500 is on ground 501 or in the air. To detect this position, a high voltage insulating rod 502 is used, which changes the status of a button 503 or a pressure sensor. This change in status is detected by an electronic evaluation system 504. Only when the electrode 500 is in contact with the substrate of the base 501 can the application be put into operation. If the ground contact is released during operation, the application switches off automatically.

A circuit with a positive and a negative electrode can determine the biological effect of the application. The circuit is only closed when the electrodes are in contact with the substrate. This change of state can be used to determine whether the electrodes are in the target position, i.e. whether they have ground contact, by measuring the power or current. If a voltage is applied to the electrodes and the measured current is about 0 A, it can be assumed that the system is not ready for use. This can have two causes: The electrodes are not in the target position or the ground is too high impedance to allow current flow. In both cases an application is not effective. In principle, the full operating voltage is not required to generate a test current. The required test voltage results from the fact that the earth conductivity must fall below a certain value for the application.

In summary, this means that when the test voltage is switched on, a limit value for the current flow must be exceeded in order to start the application. A further determination of the test voltage may represent safety-related restrictions. If the electrodes are not in the target position, no dangerous test voltage may be applied to the electrodes. For this reason the test voltage can be a high-frequency alternating voltage or a pulsed voltage. A performance evaluation during operation can be used to detect a possible deviation from the target position. If a limit value is not reached during the application, the operation is automatically terminated and the user is informed that either the substrate is too high impedance or the target position of the electrodes has been left.

To measure the frame height, at least one ultrasonic or radar sensor 550 on frame 551 can also be used, which measures the distance between the floor 552 and frame 551 (see FIG. 36). This is attached to frame 551 in such a way that the measurement signal 553 constantly leaves the sensor 550 in the direction of an object 554 on the ground 552. The angle between measurement signal 553 and floor 552 is 90°. In case of unevenness this angle can deviate by several degrees. In principle, several ultrasonic sensors can be used on each frame 551 to achieve redundancy. In principle, the sensors 550 can be mounted at any height of the frame 551 and detect objects 554, which are located inside the measuring funnel 555, with a largely adjustable value to the sensor.

If the ground 552 is overgrown, it is possible to differentiate between different height levels. FIG. 36 distinguishes between the distance to the ground (d1) and the distance to the plant (d2). In most applications, the height to the ground is decisive, as this is usually decisive for the safety assessment. The height of the vegetation must be known in order to calculate back from d2 to d1. In principle, an adjustment without a known height of vegetation is also possible. In this case the reference height is the height of the plant.

Figure 37:
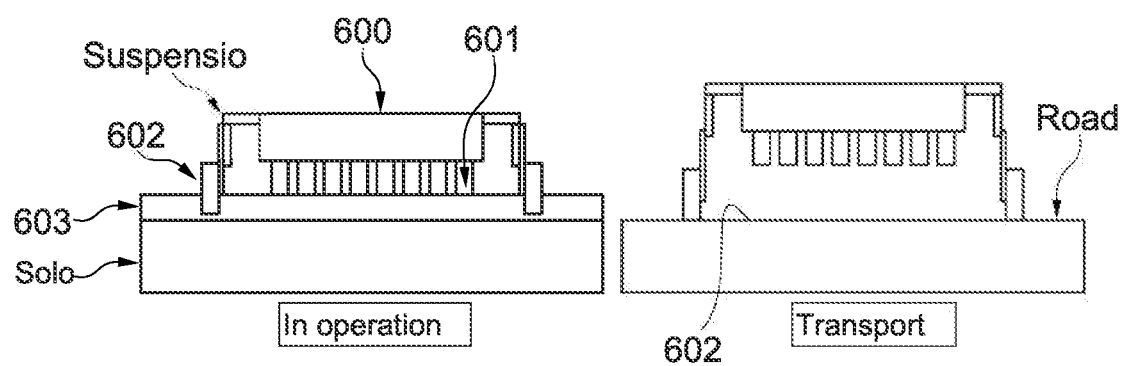

If the frame 600, which contains the electrodes 601, is not held by a jack of a drive vehicle 557, but has its own wheels 602, these can be height-adjustable (see FIG. 37). For transport (right illustration), the electrodes 601 can be lifted so that they do not touch the floor 602 during transport. In addition, the height of the electrodes 601 can be adjusted depending on the height and type of vegetation 603. Height-adjustable wheels 602 can be used on any stele of the system. This setting influences the contact pressure on the plant, which, depending on the application, is one of the optimization parameters.

In summary, the use of non-isolated high voltage (electrodes) raises safety issues with regard to fault detection and avoidance of body currents both when the high voltage and the carrier vehicle or attachments are in direct contact.

The main objective is therefore to avoid high voltage on touchable parts. A simple high-voltage insulation of the voltage source is used to prevent this. If this insulation fails, however, it can lead to lethal body currents when touched. The solution lies in a defined grounding with current measurement. A fault can be detected and the system can be switched off.

Due to the conditions of the underground (high vegetation), however, high voltage can also be present on the vehicle, although there is no insulation fault. This is the case when plants touch both the high voltage electrodes and the vehicle. Therefore, an insulation of the vehicle or the subsoil is suggested.

Another possibility to avoid body currents when touching the vehicle is an additional insulation, e.g. between applicator and vehicle. Despite the loss of insulation of the first insulation, there is no high voltage on the vehicle. The vehicle can therefore be touched without a body current flowing. To detect the fault now, grounding the system is of no use. However, the voltage between vehicle and applicator can be measured to detect the fault. If the voltage exceeds a limit value, the system is switched off.

Proximity lock, sensor and target position detection are necessary to avoid direct contact with humans.

The invention claimed is:

1. A device (1) for treating a soil (6) comprising the following elements:
a carrier vehicle (2), the carrier vehicle comprising a chassis (3),
a housing (242) with electrical components,
a safety device comprising a high-voltage device (4) for generating a high voltage and high-voltage electrodes (5) for introducing the high voltage into a first soil area (7) for weed inactivation, wherein the safety device further comprises one or more of a high-voltage insulation monitor, a multi-stage electrical insulation, a proximity sensor, a proximity interlock and a target position detector, and
a grounding element (15),
wherein the high-voltage device (4) is arranged behind a rear of the carrier vehicle (2) and the high-voltage electrodes (5) are arranged at the carrier vehicle (2) for introducing the high voltage into the first soil area (7), and the safety device further comprises a measuring device (21) with evaluation electronics (22) to measure a fault current (16) or a fault voltage between individual elements of the device (1) for treating soil or between individual elements of the device (1) for treating soil and the grounding element (15) which serves to discharge a fault current (16) in a second, different soil area (19),
wherein the measuring device (21) comprises a plurality of sensors (41, 42, 51, 52, 53) arranged to measure residual and leakage currents and the evaluation electronics (22) are configured to detect a current fault and an insulation fault based on the measured currents, wherein a first sensor (41) of the plurality of sensors is arranged to measure leakage currents and a filter of the measuring device is disposed in parallel to the first sensor (41) to measure the residual currents to separate the residual currents and the leakage currents; and wherein another sensor (42, 51, 52, 53) of the plurality of sensors is arranged to detect insulation faults between a high-voltage output of the high-voltage device (4) and the chassis (3) or between the chassis (3) and other elements of the device for treating soil to determine a location of the insulation faults.

2. The device according to claim 1, characterized in that a distance between the high-voltage electrodes (5) and the grounding element (15) is at least 2 m.

3. The device according to claim 2, characterized in that a distance between the high-voltage electrodes (5) and the grounding element (15) is more than 3 m.

4. The device according to claim 1, characterized in that the grounding element (15) comprises a chain with or without cable attached thereto, at least one cutting element and/or conductive mats.

5. The device according to claim 1, characterized in that the grounding element (15) comprises at least one wheel (121) which is electrically conductively connected to the chassis (126) or an add-on part.

6. The device according to claim 1, characterized in that the grounding element (15) has a plurality of grounding points (23 to 26) spaced apart by at least 5 cm for derivation into different ground regions.

7. The device according to claim 1, characterized in that the high-voltage device (4) has a plurality of modules whose power is regulated and limited and/or the high-voltage device (4) has a plurality of converters connected in parallel.

8. The device according to claim 1, characterized in that the high-voltage electrodes (5) are arranged in an applicator space (27) which is insulated with respect to the chassis (3) or an add-on part.

9. The device according to claim 1, characterized in that individual elements, the chassis, a receptacle for attachments, an adapter or applicators are made of electrically insulating material, wherein the adapter is arranged between the receptacle and the applicator.

10. The device according to claim 1, characterized in that for introducing the high voltage into the first soil area (7), the high voltage electrodes (5, 31, 32, 33) are arranged in front of and to the side of the carrier vehicle (2).

11. The device according to claim 1, characterized in that the device comprises at least one wheel which is electrically conductive for rolling on a rail.

12. The device according to claim 1, characterized in that the device comprises several high-voltage modules with high-voltage outputs, in which at least one pole of the high-voltage outputs is bridged with the high-voltage outputs of the other modules with the same polarity in order to prevent series connection of the high-voltage modules.

13. The device according to claim 1, characterized in that the evaluation electronics comprise a safety relay which is connected in series with emergency stop switches and further partial safety units.

14. A method for operating a device according to claim 1, characterized in that the introducing the high voltage is interrupted when the earth current at a fault current or fault voltage measuring device (21) exceeds a limit value or proximity barrier or proximity sensor have detected a fault.

15. The method according to claim 14, characterized in that the measuring device is used to determine the ground impedance or the load impedance by voltage and/or current measurement.

* * * * *